United States Patent
Shigaki et al.

(10) Patent No.: US 9,627,217 B2
(45) Date of Patent: Apr. 18, 2017

(54) SILICON-CONTAINING EUV RESIST UNDERLAYER FILM-FORMING COMPOSITION INCLUDING ADDITIVE

(71) Applicant: NISSAN CHEMICAL INDUSTRIES, LTD., Tokyo (JP)

(72) Inventors: Shuhei Shigaki, Toyama (JP); Hiroaki Yaguchi, Toyama (JP); Wataru Shibayama, Toyama (JP); Rikimaru Sakamoto, Toyama (JP); BangChing Ho, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 14/390,870

(22) PCT Filed: Feb. 22, 2013

(86) PCT No.: PCT/JP2013/054535
§ 371 (c)(1),
(2) Date: Oct. 6, 2014

(87) PCT Pub. No.: WO2013/161372
PCT Pub. Date: Oct. 31, 2013

(65) Prior Publication Data
US 2015/0079792 A1 Mar. 19, 2015

(30) Foreign Application Priority Data
Apr. 23, 2012 (JP) .................. 2012-097436

(51) Int. Cl.
| H01L 21/308 | (2006.01) |
| G03F 7/11 | (2006.01) |
| G03F 7/075 | (2006.01) |
| G03F 7/09 | (2006.01) |
| C09D 183/04 | (2006.01) |
| C09D 183/08 | (2006.01) |
| C08G 77/26 | (2006.01) |
| C08G 77/388 | (2006.01) |

(52) U.S. Cl.
CPC ........ H01L 21/3081 (2013.01); C09D 183/04 (2013.01); C09D 183/08 (2013.01); G03F 7/0751 (2013.01); G03F 7/0752 (2013.01); G03F 7/091 (2013.01); G03F 7/094 (2013.01); H01L 21/3086 (2013.01); C08G 77/26 (2013.01); C08G 77/388 (2013.01)

(58) Field of Classification Search
None
See application file for complete search history.

(56) References Cited

U.S. PATENT DOCUMENTS

| 2010/0291487 A1 | 11/2010 | Nakajima et al. |
| 2010/0304305 A1 | 12/2010 | Nakajima et al. |
| 2012/0196225 A1* | 8/2012 | Li .................. G03F 7/0757 430/270.1 |
| 2012/0315765 A1* | 12/2012 | Nakajima ............ C07F 7/1836 438/694 |
| 2014/0377957 A1* | 12/2014 | Takeda .................. G03F 7/11 438/703 |

FOREIGN PATENT DOCUMENTS

| EP | 2 479 615 A1 * | 7/2012 |
| JP | 2007-226170 A | 9/2007 |
| JP | 2008-076889 A | 4/2008 |
| JP | 2009-244722 A | 10/2009 |
| JP | 2010-237667 A | 10/2010 |
| WO | 2009/034998 A1 | 3/2009 |
| WO | 2009/088039 A1 | 7/2009 |
| WO | 2011/033965 A1 | 3/2011 |
| WO | 2011/102470 A1 | 8/2011 |
| WO | 2011/105368 A1 | 9/2011 |
| WO | 2012/117949 A1 | 9/2012 |

OTHER PUBLICATIONS

English translation of WO 2011/105368 A1 by Google translate from WIPo patentscope website on Jul. 16, 2015, 42 pages.*
English translation of JP 2009-244722 a from AIPN Japan Patent Office National Center for Industrial Property Information and Training, generated Sep. 6, 2015, 14 pages.*
English translation of WO 2011/105368 a a1 generated Jul. 17, 2016 from Wipo website named Patentscope, 17 pages.*
Sakamoto, R. et al., "The novel spin-on hard mask and ultrathin UL material for EUVL," International Symposium on EUVL, Oct. 2011, pp. 1-31 (excluding title page), <http://www.sematech.org/meetings/archives/litho/euvl/10157EUVL/pres/Rikimaru%20Sakamoto.pdf>, retrieved on Mar. 6, 2013.
Mar. 19, 2013 International Search Report issued in International Patent Application No. PCT/JP2013/054535.
Mar. 19, 2013 Written Opinion of the International Searching Authority issued in International Patent Application No. PCT/JP2013/054535.

* cited by examiner

*Primary Examiner* — Cynthia Hamilton
(74) *Attorney, Agent, or Firm* — Oliff PLC

(57) ABSTRACT

There is provided a composition for forming an EUV resist underlayer film which shows a good resist form. A resist underlayer film-forming composition for EUV lithography, including: polysiloxane (A) containing a hydrolyzed condensate of hydrolyzable silane (a); and hydrolyzable silane compound (b) having a sulfonamide structure, a carboxylic acid amide structure, a urea structure, or an isocyanuric acid structure. A resist underlayer film-forming composition for EUV lithography, including: polysiloxane (B) containing a hydrolyzed condensate of hydrolyzable silane (a) and hydrolyzable silane compound (b) having a sulfonamide structure, a carboxylic acid amide structure, a urea structure, or an isocyanuric acid structure. The polysiloxane (A) is preferably a co-hydrolyzed condensate of a tetraalkoxysilane, an alkyltrialkoxysilane and an aryltrialkoxysilane.

14 Claims, No Drawings

SILICON-CONTAINING EUV RESIST UNDERLAYER FILM-FORMING COMPOSITION INCLUDING ADDITIVE

TECHNICAL FIELD

The present invention relates to a composition for forming an underlayer film between a substrate and a resist (for example, an EUV resist) that are used for manufacturing semiconductor devices. Specifically, the present invention relates to a resist underlayer film-forming composition for lithography, with which underlayer films used as underlayers of resists in a lithography process for manufacturing semiconductor devices can be formed. The present invention further relates to a method for forming a resist pattern by using the underlayer film-forming composition.

BACKGROUND ART

Conventionally, in manufacturing semiconductor devices, fine processing by lithography utilizing photoresists has been employed. The fine processing is a processing method includes forming a thin film of a photoresist on a semiconductor substrate such as a silicon wafer; irradiating the substrate with active light such as ultraviolet through a mask pattern having a pattern of semiconductor device; developing the substrate; and etching the substrate with the obtained photoresist pattern as a protection film. This forms fine concavities and convexities corresponding to the pattern on the surface of the substrate. In recent progress in high integration of semiconductor devices, shorter wavelength active light tends to be used, i.e., an ArF excimer laser beam (193 nm) and to EUV light (13.5 nm) have been taking the place of a KrF excimer laser beam (248 nm) to.

Thus, controlling profiles (resist shapes) and improving adhesion to substrates are required for resists more than before.

As an underlayer film between a semiconductor substrate and a photoresist, a film known as a hardmask that contains a metal element such as silicon has been used. In this case, the resist and the hardmask are significantly different in their components, and thus their removal rates at which the resist and the hardmask are removed by dry etching largely depend on gaseous species used for dry etching. By selecting proper gaseous species, the hardmask can be removed by dry etching without a significant decrease in the film thickness of the photoresist. A resist underlayer film has been thus placed between a semiconductor substrate and a photoresist in order to achieve a variety of effects in the manufacture of semiconductor devices in recent years (see Patent Documents 1 and 2).

Although compositions for resist underlayer films have been studied, development of novel materials for resist underlayer films are demanded to meet diverse properties that the resist underlayer film is required to have.

PRIOR ART DOCUMENTS

Patent Documents

Patent Document 1: Japanese Patent Application Publication No. 2008-076889 (JP 2008-076889 A)
Patent Document 2: Japanese Patent Application Publication No. 2010-237667 (JP 2010-237667 A)

SUMMARY OF THE INVENTION

Problem to be Solved by the Invention

An object of the present invention is to provide a resist underlayer film-forming composition for EUV lithography that allows fine processing of a substrate by utilizing a rectangular resist pattern and that can be used in the manufacture of semiconductor devices. Specifically, an object of the present invention is to provide a resist underlayer film-forming composition for lithography that forms a resist underlayer film that can be used as a hardmask. Still another object of the present invention is to provide a resist underlayer film for lithography that improves the exposure sensitivity of an EUV resist, does not intermix with a resist, has a higher dry etching rate than the resist, and generates a small amount of outgas when exposed to EUV light; and to provide a resist underlayer film-forming composition for forming the underlayer film.

Means for Solving the Problem

The present invention provides: as a first aspect, a resist underlayer film-forming composition for EUV lithography, comprising: polysiloxane (A) containing a hydrolyzed condensate of hydrolyzable silane (a); and hydrolyzable silane compound (b) having a sulfonamide structure, a carboxylic acid amide structure, a urea structure, or an isocyanuric acid structure;

as a second aspect, a resist underlayer film-forming composition for EUV lithography, comprising: polysiloxane (B) containing a hydrolyzed condensate of hydrolyzable silane (a) and hydrolyzable silane compound (b) having a sulfonamide structure, a carboxylic acid amide structure, a urea structure, or an isocyanuric acid structure;

as a third aspect, the resist underlayer film-forming composition according to the first aspect or the second aspect, in which hydrolyzable silane (a) is at least one hydrolyzable silane selected from the group consisting of a tetraalkoxysilane, an alkyltrialkoxysilane, and an aryltrialkoxysilane;

as a fourth aspect, the resist underlayer film-forming composition according to the third aspect, in which the alkyltrialkoxysilane is a methyltrialkoxysilane;

as a fifth aspect, the resist underlayer film-forming composition according to the third aspect or the fourth aspect, in which the aryltrialkoxysilane is a phenyltrialkoxysilane;

as a sixth aspect, the resist underlayer film-forming composition according to any one of the first to the fifth aspects, in which hydrolyzable silane compound (b) is a silane compound of General Formula (b-1):

$R^3-R^2-R^1-Si(R^4)_3$  Formula (b-1)

(in Formula (b-1), $R^4$ is a $C_{1-10}$ alkoxy group, $R^1$ is a $C_{1-10}$ alkylene group, and $R^2$ is a sulfonamide structure, a carboxylic acid amide structure, a urea structure, or an isocyanuric acid structure:

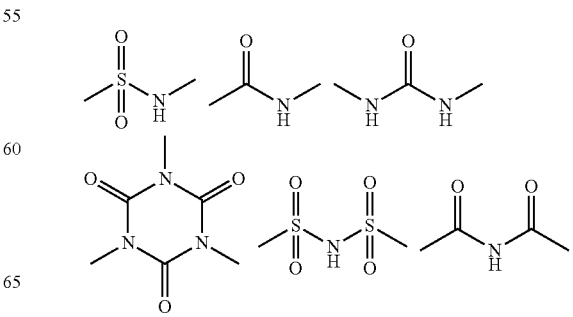

-continued

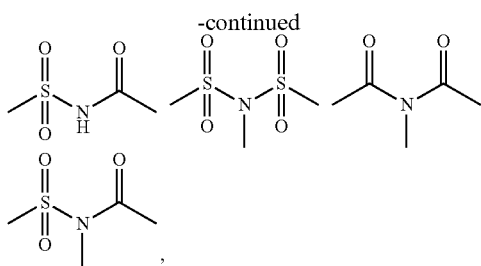

R³ is a hydrogen atom, a $C_{1-10}$ alkyl group, a $C_{1-10}$ fluoroalkyl group, a $C_{2-10}$ alkenyl group, or a $C_{6-20}$ aryl group);

as a seventh aspect, the resist underlayer film-forming composition according to any one of the first and the third to the sixth aspects, in which polysiloxane (A) is obtained by co-hydrolyzing and condensing 70 mol of a tetraalkoxysilane with 10 to 35 mol of an alkyltrialkoxysilane and 2 to 25 mol of an aryltrialkoxysilane;

as an eighth aspect, the resist underlayer film-forming composition according to any one of the first to the seventh aspects, further comprising an acid compound;

as a ninth aspect, the resist underlayer film-forming composition according to any one of the first to the eighth aspects, further comprising water;

as a tenth aspect, the resist underlayer film-forming composition according to any one of the first to the ninth aspects, further comprising an ammonium compound, a cyclic ammonium compound, a cyclic amine compound, or a sulfonium compound;

as an eleventh aspect, a resist underlayer film obtained by applying the resist underlayer film-forming composition as described in any one of the first to the tenth aspects onto a semiconductor substrate, and then baking the applied resist underlayer film-forming composition;

as a twelfth aspect, a method for manufacturing a semiconductor device, the method comprising: forming a resist underlayer film by applying the resist underlayer film-forming composition as described in any one of the first to the tenth aspects onto a semiconductor substrate, and then baking the applied resist underlayer film-forming composition; forming a resist film by applying a composition for a resist onto the resist underlayer film; exposing the resist film to light; obtaining a patterned resist film by developing the exposed resist film; etching the resist underlayer film with the patterned resist film; and processing the semiconductor substrate with the patterned resist film and the resist underlayer film;

as a thirteenth aspect, a method for manufacturing a semiconductor device, the method comprising: forming an organic underlayer film on a semiconductor substrate; forming a resist underlayer film by applying the resist underlayer film-forming composition as described in any one of the first to the tenth aspects onto the organic underlayer film, and then baking the applied resist underlayer film-forming composition; forming a resist film by applying a composition for a resist onto the resist underlayer film; exposing the resist film to light; obtaining a patterned resist film by developing the exposed resist; etching the resist underlayer film with the patterned resist film; etching the organic underlayer film with the patterned resist underlayer film; and processing the semiconductor substrate with the patterned organic underlayer film; and as a fourteenth aspect, the method for manufacturing a semiconductor device according to the twelfth or the thirteenth aspect, in which the development is conducted with an alkaline aqueous solution or an organic solvent.

Effects of the Invention

The resist underlayer film-forming composition of the present invention contains the hydrolyzed condensate of a hydrolyzable silane, that is, contains a polyorganosiloxane structure. Thus, a resist underlayer film formed with the composition is sufficiently resistant to an oxygen based dry etching gas that is used for etching of a substrate and an organic underlayer film formed on the substrate, so that the resist underlayer film can serve as a hardmask and an anti-reflective coating, in the manufacture of semiconductor devices.

In the resist underlayer film-forming composition of the present invention, the hydrolyzable silane compound having the specific structure of above may balance the amount of an acid generated from an photo acid generator that exists at the interface between an EUV resist film and an underlayer film, which may reduce defect of the shape of a resist pattern caused by the acid.

Including the hydrolyzable silane compound in the resist underlayer film-forming composition of the present invention makes it possible to improve adhesion between the resist underlayer film formed from the composition and a resist film. In addition, the hydrolyzable silane compound may be incorporated in the polyorganosiloxane structure because the compound has a hydrolyzable group, whereby outgas generation can be suppressed.

MODES FOR CARRYING OUT THE INVENTION

In the present invention, the resist underlayer film is formed on a substrate by an application method, or is formed on an organic underlayer film on a substrate by an application method, and then a resist film (for example, an EUV resist) is formed on the resist underlayer film. After that, a resist pattern is formed by light exposure and development, and the resist pattern is used to dry-etch the resist underlayer film to transfer the pattern, which is then used to process the substrate. Alternatively the organic underlayer film is etched to transfer the pattern and used to process the substrate.

In the fabrication of the fine patterns, thinner resist films are used more frequently than before in order to prevent pattern collapse. The thinning of resists requires the etching rate of the underlayer film thereof to be higher than that of the resist film, otherwise a pattern cannot be transferred to the underlayer film by dry etching. In the present invention, a substrate is coated with the resist underlayer film of the present invention (containing an inorganic silicon compound) directly, or through an organic underlayer film, and the coated substrate is further coated with a resist film (an organic resist film). Depending on a selection of an etching gas, a film having an organic component and a film having an inorganic component have significantly different dry etching rates. The dry etching rate of a film having an organic component increases by using an oxygen based gas, whereas the dry etching rate of a film having an inorganic component increases by using a halogen-containing gas.

For example, after a resist pattern is formed, the resist underlayer film of the present invention, which exists under the resist film, is dry etched with a halogen-containing gas to transfer the pattern onto the resist underlayer film, and a substrate is processed by using the pattern transferred to the resist underlayer film, with a halogen-containing gas. Alternatively, an organic underlayer film, which exists under the resist underlayer film, is dry etched by using the resist underlayer film having the pattern thereon with an oxygen based gas to transfer the pattern onto the organic underlayer film, and a substrate is processed by using the organic underlayer film having the pattern thereon with a halogen-containing gas.

In the present invention, the resist underlayer film serves as a hardmask. A hydrolyzable group, such as an alkoxy group, an acyloxy group, and a halogen group contained in the structure is hydrolyzed or partially hydrolyzed, and then a polymer having a polysiloxane structure is formed by a condensation reaction of silanol groups. The polyorganosiloxane structure is sufficiently functional as a hardmask.

The polyorganosiloxane structure (an intermediate film) is useful as a hardmask in etching of an organic underlayer film existing thereunder and in processing (etching) of a substrate. In other words, the polyorganosiloxane structure is sufficiently resistant to dry etching during processing of a substrate, and to an oxygen based dry etching gas for an organic underlayer film.

By using the silane compound with the polysiloxane in the present invention, a resist can have a rectangular shape in lithography of an EUV resist. When an acid generated from a photo acid generator contained in an EUV resist exists at an interface between the EUV resist and the underlayer film, the bottom of a resist pattern tends to be formed in an undercut shape. In contrast, when an acid insufficiently exists at the interface between the EUV resist and the underlayer film, the bottom of the resist pattern is formed in a footing shape. In the present invention, the silane compound is added to neutralize (quench) an acid existing at an interface, or to provide an acid to the interface so that the shape of a resist pattern can be improved. Accordingly, the silane compound to be added is preferably a compound that becomes a base by photodegradation or that traps an acid with basicity of the silane compound itself and/or through a hydrogen bond. The silane compound to be added preferably generates secondary electrons and/or an acid with light. As stated, by adding the silane compound, an acid at the interface can be balanced.

The silane compound also improves adhesion to a resist.

Because the silane compound has a hydrolyzable group, a silanol group of the compound is bonded to a polysiloxane and is incorporated in the polysiloxane, whereby outgas can be suppressed at the time of exposure.

The present invention provides a resist underlayer film-forming composition for EUV lithography, comprising polysiloxane (A) containing a hydrolyzed condensate of hydrolyzable silane (a); and hydrolyzable silane compound (b) having a sulfonamide structure, a carboxylic acid amide structure, a urea structure, or an isocyanuric acid structure.

The present invention also provides a resist underlayer film-forming composition for EUV lithography, comprising polysiloxane (B) containing a hydrolyzed condensate of hydrolyzable silane (a) and hydrolyzable silane compound (b) having a sulfonamide structure, a carboxylic acid amide structure, a urea structure, or an isocyanuric acid structure.

Although the hydrolyzed condensate of above is a polysiloxane, a hydrolysate that has not complete hydrolysis when a hydrolyzed condensate is obtained, a partial hydrolysate, and a mixture in which a silane compound is mixed in a hydrolyzed condensate can also be used.

The resist underlayer film-forming composition of the present invention contains polysiloxane (A) or polysiloxane (B) described above, and further contains a solvent. As optional components, an acid, water, an alcohol, a curing catalyst, an acid generator, another organic polymer, a light absorbing compound, a surfactant, and the like can be contained.

A solid content in the resist underlayer film-forming composition of the present invention is, for example, 0.1 to 50% by mass, or 0.1 to 30% by mass, or 0.1 to 25% by mass. Note that the solid content refers to a content of all components except solvent components of the resist underlayer film-forming composition.

A percentage of polysiloxane (A) or polysiloxane (B) in a solid content is 20% by mass or greater, for example, 50 to 99.999% by mass, or 60 to 99.99% by mass, or 70 to 99.5% by mass.

Hydrolyzable silane compound (b) can be added within a range of 0.001 to 15% by mass, or 0.01 to 15% by mass, or 1 to 15% by mass, or 5 to 10% by mass of polysiloxane (A).

Polysiloxane (A) used in the present invention is a hydrolyzed condensate of hydrolyzable silane (a), and hydrolyzable silane (a) is a co-hydrolyzed condensate of hydrolyzable silanes that are selected from the group consisting of a tetraalkoxysilane, an alkyltrialkoxysilane, and an aryltrialkoxysilane. Polysiloxane (A) is preferably a co-hydrolyzed condensate of a tetraalkoxysilane, an alkyltrialkoxysilane, and an aryltrialkoxysilane.

The tetraalkoxysilane is a silane compound, such as tetramethoxysilane, tetraethoxysilane, tetraisopropoxysilane, and tetrabutoxysilane.

The alkyl group of the alkyltrialkoxysilane is a linear or branched alkyl group having a carbon atom number of 1 to 10, and examples thereof include a methyl group, an ethyl group, an n-propyl group, an i-propyl group, an n-butyl group, an i-butyl group, an s-butyl group, a t-butyl group, an n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, an n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, and a 1-ethyl-2-methyl-n-propyl group. A cyclic alkyl group can also be used, and examples of a $C_{1-10}$ cyclic alkyl group include a cyclopropyl group, a cyclobutyl group, a 1-methyl-cyclopropyl group, a 2-methyl-cyclopropyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-i-propyl-cyclopropyl group, a 2-i-propyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group, and a 2-ethyl-3-methyl-cyclopropyl group.

Among them, a methyl group is preferably used. Examples of a hydrolysis group include a methoxy group, an ethoxy group, an isopropoxy group, and a butoxy group.

Examples of the aryl group of the aryltrialkoxysilane include: a substituted or unsubstituted phenyl group, and a naphthyl group. In particular, a phenyl group is preferable. Examples of the substituent include halogen atoms such as a fluorine atom, a chlorine atom, a bromine atom, and an iodine atom; alkoxy groups such as a methoxy group, an ethoxy group, an n-propoxy group, and an i-propoxy group; and alkoxyalkoxy groups, such as a methoxymethoxy group, an ethoxyethoxy group, a methoxyethoxy group, and an ethoxymethoxy group.

Examples of the hydrolysis group include a methoxy group, an ethoxy group, an isopropoxy group, and a butoxy group.

The aryltrialkoxysilane can be exemplified as below:

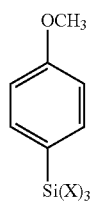

Formula (a-1-1)

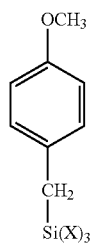

Formula (a-1-2)

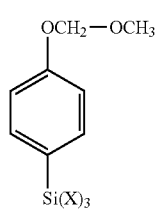

Formula (a-1-3)

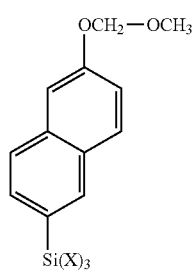

Formula (a-1-4)

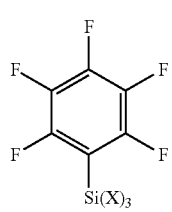

Formula (a-1-5)

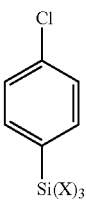

Formula (a-1-6)

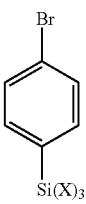

Formula (a-1-7)

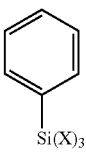

Formula (a-1-8)

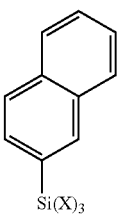

Formula (a-1-9)

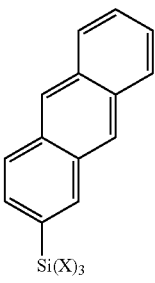

Formula (a-1-10)

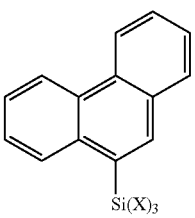

Formula (a-1-11)

(in the formulae, X is a hydrolyzable group, such as a methoxy group, an ethoxy group, an isopropoxy group, and a butoxy group).

Polysiloxane (A) is obtained by co-hydrolyzing and condensing 70 mol of a tetraalkoxysilane with 10 to 35 mol of an alkyltrialkoxysilane and 0 to 25 mol of an aryltrialkoxysilane. Preferably, polysiloxane (A) is obtained by co-hydrolyzing and condensing 70 mol of a tetraalkoxysilane with 10 to 35 mol of an alkyltrialkoxysilane and 2 to 25 mol of an aryltrialkoxysilane.

Specific examples of polysiloxane (A) are shown below.

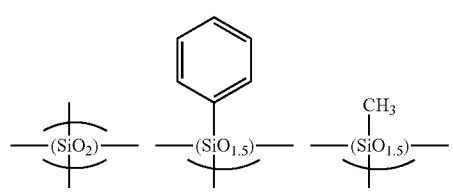
Formula (1-1)

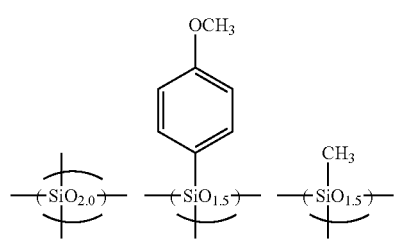
Formula (1-2)

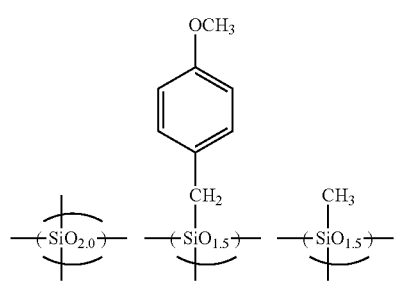
Formula (1-3)

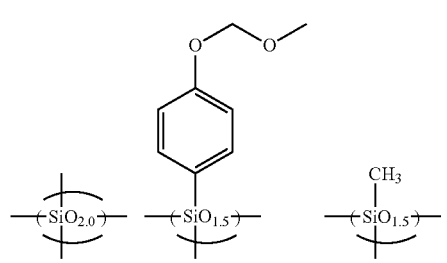
Formula (1-4)

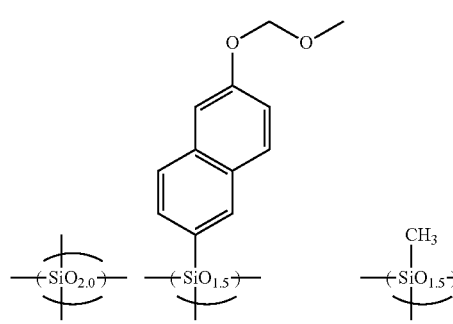
Formula (1-5)

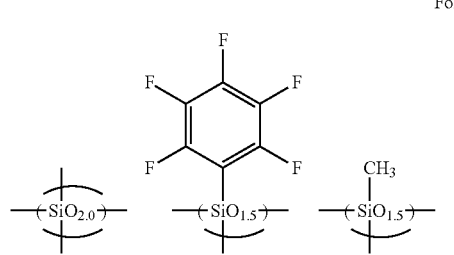
Formula (1-6)

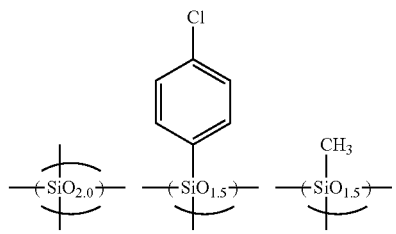
Formula (1-7)

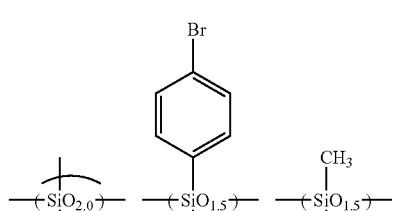
Formula (1-8)

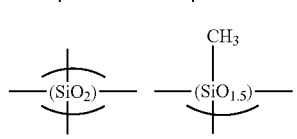
Formula (1-9)

The hydrolyzed condensate of hydrolyzable silane (a) (polysiloxane (A)) is a condensate having weight-average molecular weight of 1,000 to 1,000,000, or 1,000 to 100,000. These molecular weights are determined by GPC analyses in terms of polystyrene.

Examples of the condition for the GPC measurement include: using a GPC device (trade name: HLC-8220GPC, manufactured by Tosoh Corporation); using a GPC column (trade names: Shodex KF803L, KF802, and KF801, manufactured by Showa Denko K.K.); using a column temperature of 40° C.; using tetrahydrofuran as the eluant (elution solvent); using a flow amount (a flow rate) of 1.0 ml/min; and using polystyrene (manufactured by Showa Denko K.K.) as the standard sample.

For hydrolysis of the hydrolyzable group, water may be used in an amount of 0.5 to 100 mol, preferably 1 to 10 mol per mol of the hydrolyzable group.

Furthermore, a hydrolysis catalyst may be used in an amount of 0.001 to 10 mol, preferably 0.001 to 1 mol per mol of the hydrolyzable group.

A reaction temperature for hydrolysis and condensation is usually 20 to 90° C.

Hydrolysis may be performed completely or partially. That is, a hydrolysate, a monomer, and the like may be remained in a hydrolyzed condensate.

A catalyst can be used for hydrolysis and condensation.

Examples of the hydrolysis catalyst include a metal chelate compound, an organic acid, an inorganic acid, an organic base, and an inorganic base.

Examples of the metal chelate compound as the hydrolysis catalyst include: titanium chelate compounds, such as triethoxy-mono(acetylacetonate)titanium, tri-n-propoxy-mono(acetylacetonate)titanium, tri-i-propoxy-mono(acetylacetonate)titanium, tri-n-butoxy-mono(acetylacetonate)titanium, tri-sec-butoxy-mono(acetylacetonate)titanium, tri-t-butoxy-mono(acetylacetonate)titanium, diethoxy-bis(acetylacetonate)titanium, di-n-propoxy-bis(acetylacetonate)titanium, di-i-propoxy-bis(acetylacetonate)titanium, di-n-butoxy-bis(acetylacetonate)titanium, di-sec-butoxy-bis(acetylacetonate)titanium, di-t-butoxy-bis (acetylacetonate)titanium, monoethoxy-tris(acetylacetonate)titanium, mono-n-propoxy-tris(acetylacetonate)titanium, mono-i-propoxy-tris(acetylacetonate)titanium, mono-n-butoxy-tris(acetylacetonate)titanium, mono-sec-butoxy-tris(acetylacetonate)titanium, mono-t-butoxy-tris(acetylacetonate)titanium, tetrakis(acetylacetonate)titanium, triethoxy-mono(ethyl acetoacetate)titanium, tri-n-propoxy-mono(ethyl acetoacetate)titanium, tri-i-propoxy-mono(ethyl acetoacetate)titanium, tri-n-butoxy-mono(ethyl acetoacetate)titanium, tri-sec-butoxy-mono(ethyl acetoacetate)titanium, tri-t-butoxy-mono(ethyl acetoacetate)titanium, diethoxy-bis(ethyl acetoacetate)titanium, di-n-propoxy-bis(ethyl acetoacetate)titanium, di-i-propoxy-bis(ethyl acetoacetate)titanium, di-n-butoxy-bis(ethyl acetoacetate)titanium, di-sec-butoxy-bis(ethyl acetoacetate)titanium, di-t-butoxy-bis(ethyl acetoacetate)titanium, monoethoxy-tris(ethyl acetoacetate)titanium, mono-n-propoxy-tris(ethyl acetoacetate)titanium, mono-i-propoxy-tris(ethyl acetoacetate)titanium, mono-n-butoxy-tris(ethyl acetoacetate)titanium, mono-sec-butoxy-tris(ethyl acetoacetate)titanium, mono-t-butoxy-tris(ethyl acetoacetate)titanium, tetrakis(ethyl acetoacetate)titanium, mono(acetylacetonate)tris(ethyl acetoacetate)titanium, bis(acetylacetonate)bis(ethyl acetoacetate)titanium, and tris(acetylacetonate)mono(ethyl acetoacetate)titanium; zirconium chelate compounds, such as triethoxy-mono(acetylacetonate)zirconium, tri-n-propoxy-mono(acetylacetonate)zirconium, tri-i-propoxy-mono(acetylacetonate)zirconium, tri-n-butoxy-mono(acetylacetonate)zirconium, tri-sec-butoxy-mono(acetylacetonate)zirconium, tri-t-butoxy-mono(acetylacetonate)zirconium, diethoxy-bis(acetylacetonate)zirconium, di-n-propoxy-bis(acetylacetonate)zirconium, di-i-propoxy-bis(acetylacetonate)zirconium, di-n-butoxy-bis(acetylacetonate)zirconium, di-sec-butoxy-bis(acetylacetonate)zirconium, di-t-butoxy-bis(acetylacetonate)zirconium, monoethoxy-tris(acetylacetonate)zirconium, mono-n-propoxy-tris(acetylacetonate)zirconium, mono-i-propoxy-tris(acetylacetonate)zirconium, mono-n-butoxy-tris(acetylacetonate)zirconium, mono-sec-butoxy-tris(acetylacetonate)zirconium, mono-t-butoxy-tris(acetylacetonate)zirconium, tetrakis(acetylacetonate)zirconium, triethoxy-mono(ethyl acetoacetate)zirconium, tri-n-propoxy-mono(ethyl acetoacetate)zirconium, tri-i-propoxy-mono(ethyl acetoacetate)zirconium, tri-n-butoxy-mono(ethyl acetoacetate)zirconium, tri-sec-butoxy-mono(ethyl acetoacetate)zirconium, tri-t-butoxy-mono(ethyl acetoacetate)zirconium, diethoxy-bis(ethyl acetoacetate)zirconium, di-n-propoxy-bis(ethyl acetoacetate)zirconium, di-i-propoxy-bis(ethyl acetoacetate)zirconium, di-n-butoxy-bis(ethyl acetoacetate)zirconium, di-sec-butoxy-bis(ethyl acetoacetate)zirconium, di-t-butoxy-bis(ethyl acetoacetate)zirconium, monoethoxy-tris(ethyl acetoacetate)zirconium, mono-n-propoxy-tris(ethyl acetoacetate)zirconium, mono-i-propoxy-tris(ethyl acetoacetate)zirconium, mono-n-butoxy-tris(ethyl acetoacetate)zirconium, mono-sec-butoxy-tris(ethyl acetoacetate)zirconium, mono-t-butoxy-tris(ethyl acetoacetate)zirconium, tetrakis (ethyl acetoacetate)zirconium, mono(acetylacetonate)tris(ethyl acetoacetate)zirconium, bis(acetylacetonate)bis(ethyl acetoacetate)zirconium, and tris(acetylacetonate)mono(ethyl acetoacetate)zirconium; and aluminum chelate compounds, such as tris(acetylacetonate)aluminum and tris(ethyl acetoacetate)aluminum.

Examples of the organic acid as the hydrolysis catalyst include: acetic acid, propionic acid, butanoic acid, pentane acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, shikimic acid, 2-ethylhexanoic acid, oleic acid, stearic acid, linoleic acid, linolenic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, and tartaric acid.

Examples of the inorganic acid as the hydrolysis catalyst include hydrochloric acid, nitric acid, sulfuric acid, fluorinated acid, and phosphoric acid.

Examples of the organic base as the hydrolysis catalyst include: pyridine, pyrrole, piperazine, pyrrolidine, piperidine, picoline, trimethylamine, triethylamine, monoethanolamine, diethanolamine, dimethyl monoethanolamine, monomethyl diethanolamine, triethanolamine, diazabicyclooctane, diazabicyclononane, diazabicycloundecene, and tetramethylammonium hydroxide. Examples of the inorganic base as the hydrolysis catalyst include ammonia, sodium hydroxide, potassium hydroxide, barium hydroxide, and calcium hydroxide. Among these catalysts, a metal chelate compound, an organic acid, and an inorganic acid are preferable, and these may be used alone, or two or more of them may be used at the same time.

Examples of an organic solvent used for hydrolysis include: aliphatic hydrocarbon solvents, such as n-pentane, i-pentane, n-hexane, i-hexane, n-heptane, i-heptane, 2,2,4-trimethylpentane, n-octane, i-octane, cyclohexane, and methyl cyclohexane; aromatic hydrocarbon solvents, such as benzene, toluene, xylene, ethyl benzene, trimethyl benzene, methylethyl benzene, n-propyl benzene, i-propyl benzene, diethyl benzene, i-butyl benzene, triethyl benzene, di-i-propyl benzene, n-amyl naphthalene, and trimethyl benzene; monoalcohol solvents, such as methanol, ethanol, n-propanol, i-propanol, n-butanol, i-butanol, sec-butanol, t-butanol, n-pentanol, i-pentanol, 2-methyl butanol, sec-pentanol, t-pentanol, 3-methoxy butanol, n-hexanol, 2-methyl pentanol, sec-hexanol, 2-ethyl butanol, sec-heptanol, heptanol-3, n-octanol, 2-ethyl hexanol, sec-octanol, n-nonyl alcohol, 2,6-dimethyl heptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, phenylmethyl carbinol, diacetone alcohol, and cresol; polyhydric alcohol solvents, such as ethylene glycol, propylene glycol, 1,3-butylene glycol, pentanediol-2,4,2-methylpentanediol-2,4, hexanediol-2,5, heptanediol-2,4,2-ethylhexanediol-1,3, diethylene glycol, dipropylene glycol, triethylene glycol, tripropylene glycol, and glycerin; ketone solvents, such as acetone, methyl ethyl ketone, methyl-n-propyl ketone, methyl-n-butyl ketone, diethyl ketone, methyl-i-butyl ketone, methyl-n-pentyl ketone, ethyl-n-butyl ketone, methyl-n-hexyl ketone, di-i-butyl ketone, trimethyl nonanone, cyclohexanone, methylcyclohexanone, 2,4-pentanedione, acetonyl acetone, diacetone alcohol, acetophenone, and fenchone; ether solvents, such as ethyl ether, i-propyl ether, n-butyl ether, n-hexyl ether, 2-ethylhexyl ether, ethylene oxide, 1,2-propylene oxide, dioxolane, 4-methyl dioxolane, dioxane, dimethyl dioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxy triglycol, tetraethylene glycol di-n-butyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, dipropylene glycol monopropyl ether, dipropylene glycol monobutyl ether, tripropylene glycol monomethyl ether, tetrahydrofuran, and 2-methyl tetrahydrofuran; ester solvents, such as diethyl carbonate, methyl acetate, ethyl acetate, γ-butyrolactone, γ-valerolactone, n-propyl acetate, i-propyl acetate, n-butyl acetate, i-butyl acetate, sec-butyl acetate, n-pentyl acetate, sec-pentyl acetate, 3-methoxy butyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxy triglycol acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate, and diethyl phthalate; nitrogen-containing solvents, such as N-methyl formamide, N,N-dimethyl formamide, N,N-diethyl formamide, acetamide, N-methyl acetamide, N,N-dimethyl acetamide, N-methyl propionamide, and N-methylpyrrolidone; and sulfur-containing solvents, such as dimethyl sulfide, diethyl sulfide, thiophene, tetrahydro thiophene, dimethyl sulfoxide, sulfolane, and 1,3-propane sultone. These solvents may be used alone, or two or more of them may be used in combination.

In particular, ketone solvents, such as acetone, methyl ethyl ketone, methyl-n-propyl ketone, methyl-n-butyl ketone, diethyl ketone, methyl-i-butyl ketone, methyl-n-pentyl ketone, ethyl-n-butyl ketone, methyl-n-hexyl ketone, di-i-butyl ketone, trimethyl nonanone, cyclohexanone, methyl cyclohexanone, 2,4-pentanedione, acetonyl acetone, diacetone alcohol, acetophenone, and fenchone(1,1,3-trimethyl-2-norbornene) are preferable in terms of the storage stability of the solution thereof.

A hydrolyzed condensate (polymer) can be obtained by hydrolyzing and condensing a hydrolyzable organo silane in a solvent with a catalyst. An alcohol that is a byproduct, a hydrolysis catalyst used, and water can be removed at the same time by vacuum distillation or the like. An acid catalyst or a base catalyst used for the hydrolysis can be removed by neutralization, and ion exchange. In the resist underlayer film-forming composition for lithography of the present invention containing the hydrolyzed condensate thereof, an acid (for example, an organic acid), water, an alcohol, or a combination thereof can be added to stabilize the composition.

Examples of the organic acid include oxalic acid, malonic acid, methyl malonic acid, succinic acid, maleic acid, malic acid, tartaric acid, phthalic acid, citric acid, glutaric acid, citric acid, lactic acid, and salicylic acid. Among them, oxalic acid and maleic acid are preferable. The amount of the organic acid to be added is 0.5 to 5.0 parts by mass, relative to 100 parts by mass of the condensate (polyorganosiloxane). As the water to be added, pure water, ultrapure water, ion exchanged water, or the like can be used, and the water can be added in an amount of 1 part to 20 part(s) by mass, relative to 100 parts by mass of the resist underlayer film-forming composition.

An alcohol that is easily scattered by heating after coating is preferably added, and examples thereof include methanol, ethanol, propanol, isopropanol, and butanol. The alcohol can be added in an amount of 1 to 20 part(s) by mass, relative to 100 parts by mass of the resist underlayer film-forming composition.

In the present invention, hydrolyzable silane compound (b) having a sulfonamide structure, a carboxylic acid amide structure, a urea structure, or an isocyanuric acid structure can be added.

The hydrolyzable silane (b) can be represented by General Formula (b-1).

In Formula (b-1), $R^4$ is a $C_{1-10}$ alkoxy group, such as a methoxy group, an ethoxy group, an isopropoxy group, and a butoxy group. $R^1$ is a $C_{1-10}$ alkylene group, and examples thereof include a methylene group, an ethylene group, a propylene group, and a butylene group. $R^2$ is a sulfonamide structure, a carboxylic acid amide structure, a urea structure, or a isocyanuric acid structure, which are described above.

$R^3$ is a hydrogen atom, a $C_{1-10}$ alkyl group, a $C_{1-10}$ fluoroalkyl group, a $C_{2-10}$ alkenyl group, or a $C_{6-20}$ aryl group. Examples of the $C_{1-10}$ alkyl group include a methyl group, an ethyl group, a propyl group, and an isopropyl group. Examples of the $C_{2-10}$ alkenyl group include an ethenyl group, a 1-propenyl group, a 2-propenyl group, a 1-methyl-1-ethenyl group, a 1-butenyl group, a 2-butenyl group, a 3-butenyl group, a 2-methyl-1-propenyl group, a 2-methyl-2-propenyl group, a 1-ethyl ethenyl group, and a 1-methyl-1-propenyl group. In particular, a 2-propenyl group (that is, an allyl group) can be preferably used. Examples of the $C_{1-10}$ fluoro alkyl group include a perfluoro methyl group, a perfluoro ethyl group, a perfluoro propyl group, and a perfluoro butyl group. Examples of the $C_{6-20}$ aryl group include a phenyl group that may be substituted, and a naphthyl group.

The hydrolyzable silane (b) can be exemplified as below:

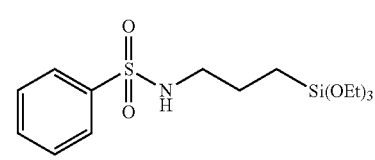

Formula (b-1-1)

Formula (b-1-2)

Formula (b-1-3)

Formula (b-1-4)

Formula (b-1-5)
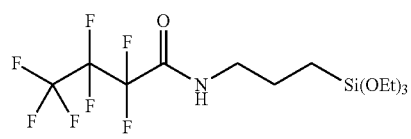
Formula (b-1-6)
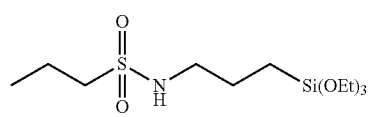
Formula (b-1-7)
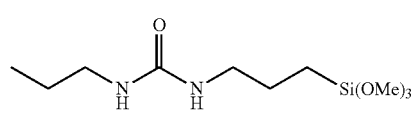
Formula (b-1-8)
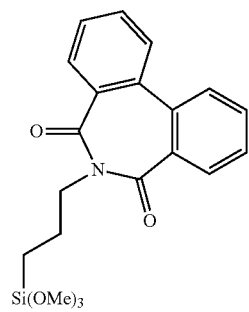
Formula (b-1-9)
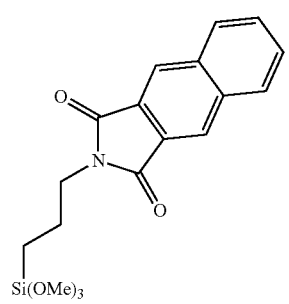
Formula (b-1-10)
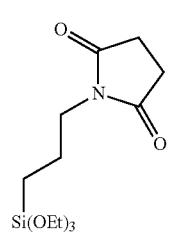
Formula (b-1-11)
Formula (b-1-12)
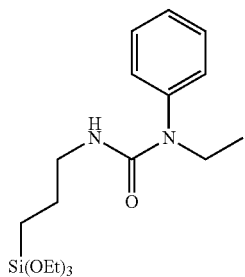
Formula (b-1-13)
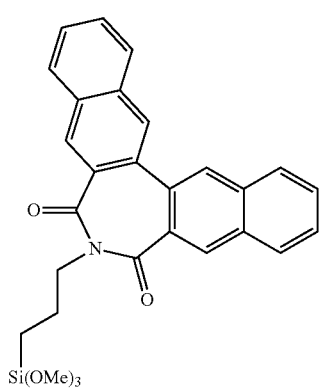
Formula (b-1-14)
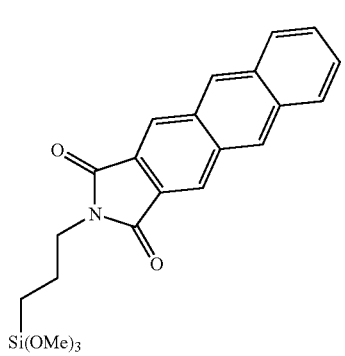
Formula (b-1-15)
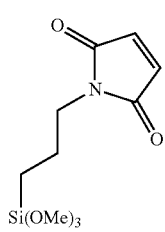
Formula (b-1-16)
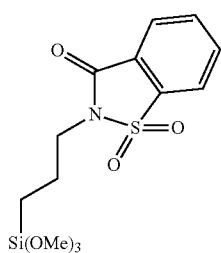

-continued

Formula (b-1-17)
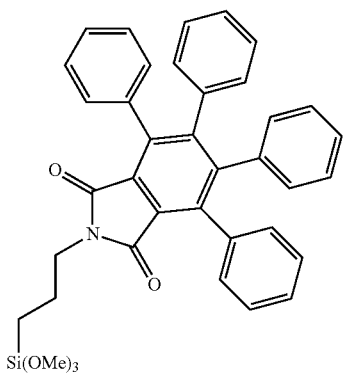

Formula (b-1-18)
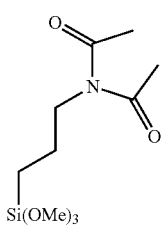

Formula (b-1-19)
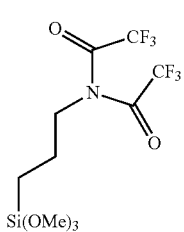

Formula (b-1-20)
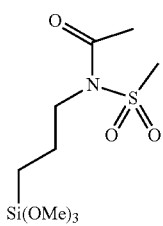

Formula (b-1-21)
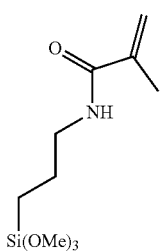

Formula (b-1-22)
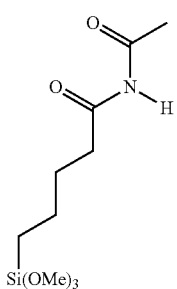

Formula (b-1-23)
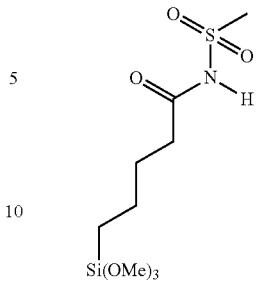

The present invention relates to a resist underlayer film-forming composition for EUV lithography, comprising hydrolyzable silane (a); and polysiloxane (B) containing a hydrolyzed condensate of hydrolyzable silane compound (b) having a sulfonamide structure, a carboxylic acid amide structure, a urea structure, or an isocyanuric acid structure.

The hydrolyzed condensate of hydrolyzable silane (a) and hydrolyzable silane (b) (polysiloxane (B)) is a condensate having weight-average molecular weight of 1,000 to 1,000,000, or 1,000 to 100,000. These molecular weights are determined by GPC analyses in terms of polystyrene.

Examples of the condition for the GPC measurement include: using a GPC device (trade name: HLC-8220GPC, manufactured by Tosoh Corporation); using a GPC column (trade names: Shodex KF803L, KF802, and KF801, manufactured by Showa Denko K.K.); using a column temperature of 40° C., using tetrahydrofuran as the eluant (elution solvent); using a flow amount (a flow rate) of 1.0 ml/min; and using polystyrene (manufactured by Showa Denko K.K.) as the standard sample.

A method for manufacturing the hydrolyzed condensate is as described above.

Specific examples of polysiloxane (B) are shown below.

Formula (B-1)
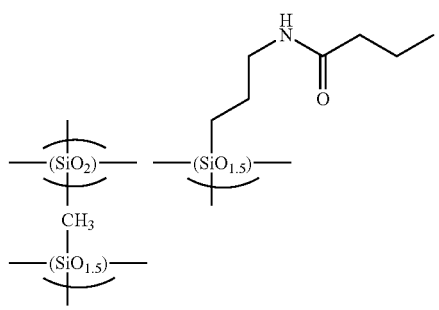

Formula (B-2)
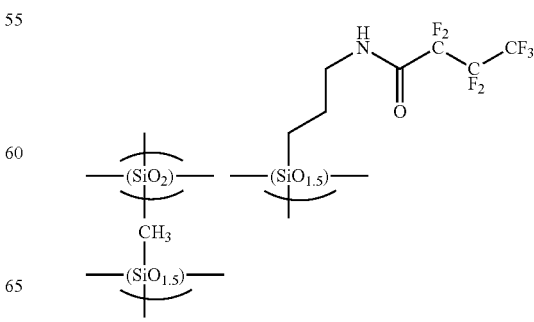

Formula (B-3)
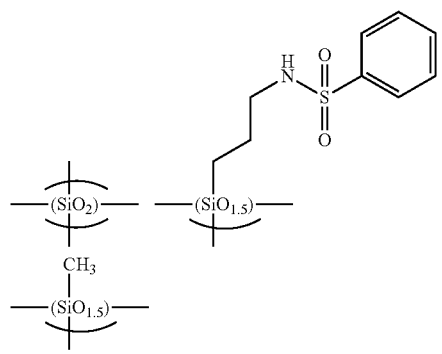
Formula (B-4)
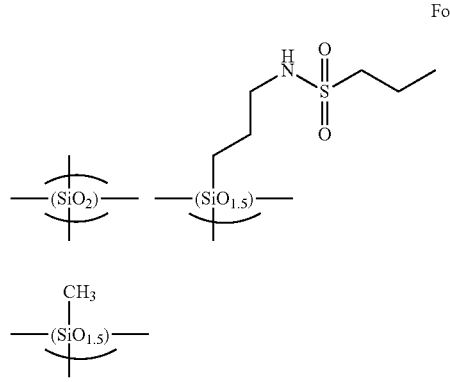
Formula (B-5)
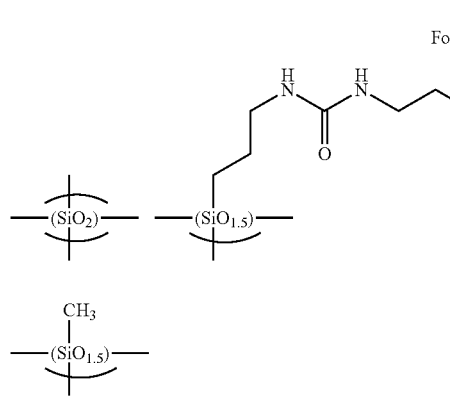
Formula (B-6)
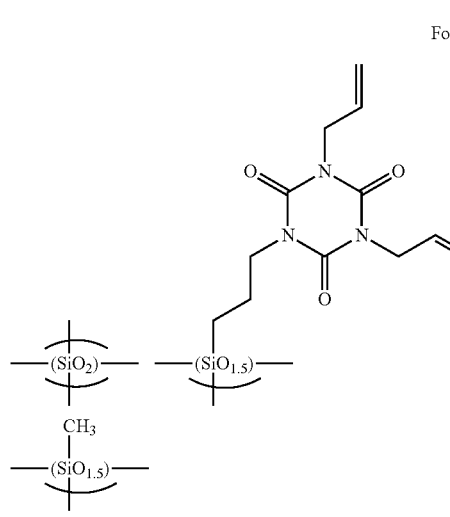
Formula (B-7)
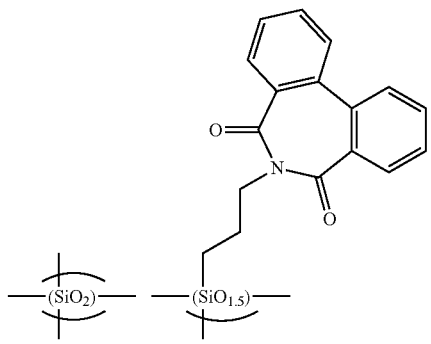
Formula (B-8)
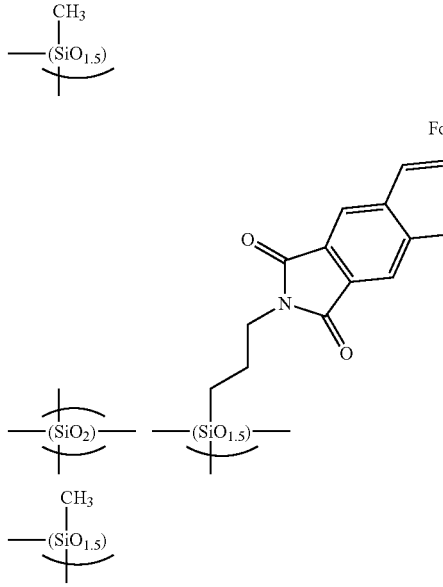
Formula (B-9)
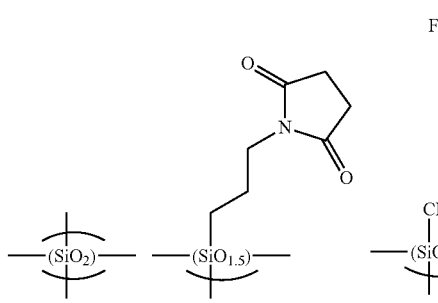
Formula (B-10)
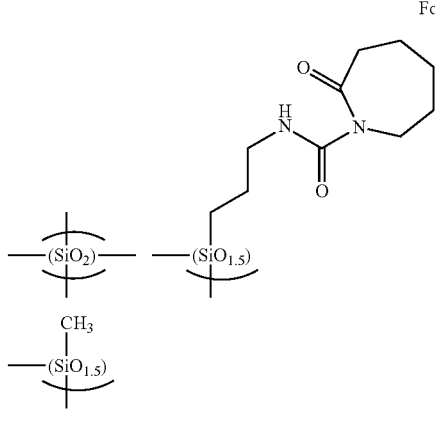

Formula (B-11)

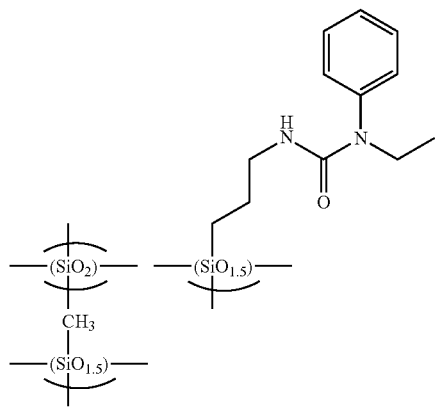

Formula (B-12)

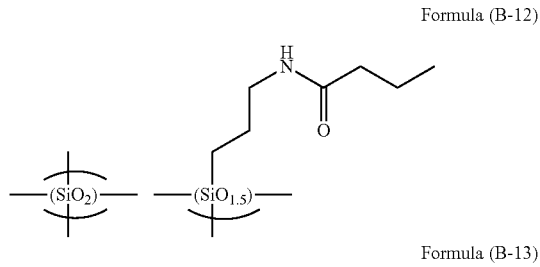

Formula (B-13)

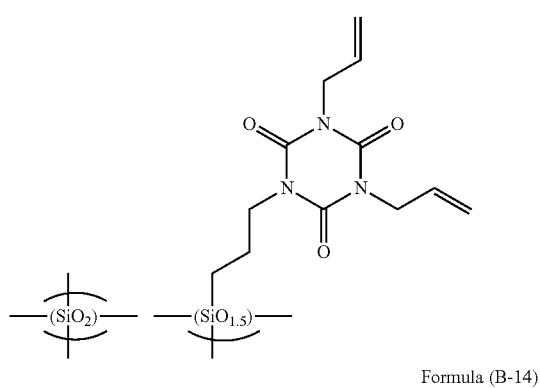

Formula (B-14)

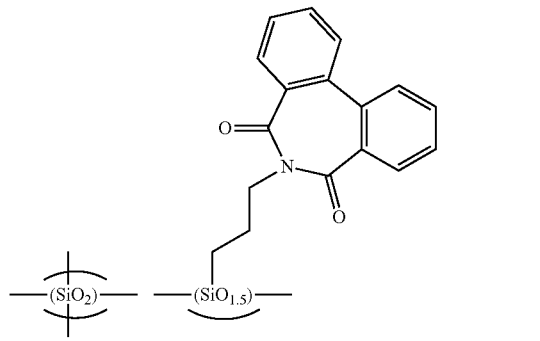

Formula (B-14-2)

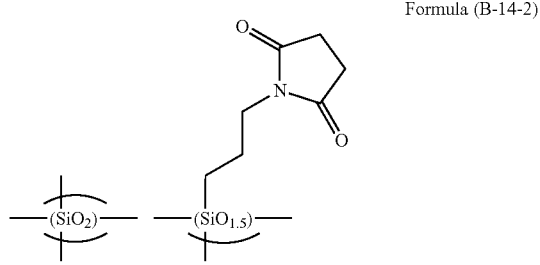

Formula (B-15)

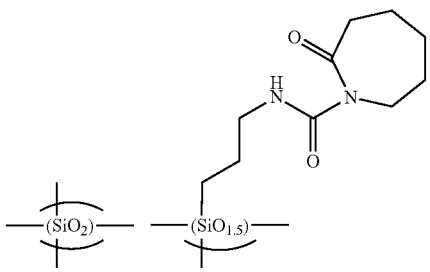

Formula (B-16)

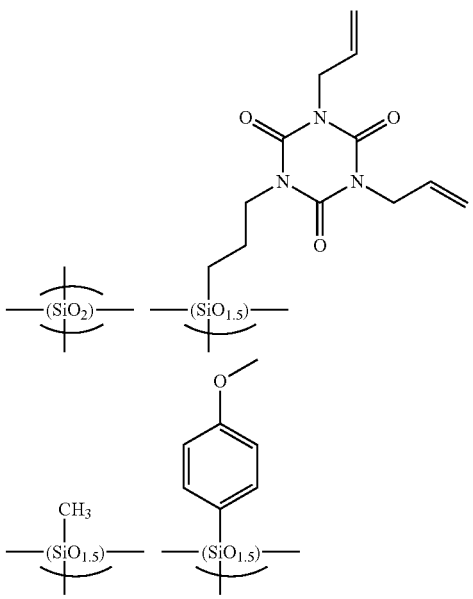

A crosslinkable compound can be contained in the present invention. As the cross-linking agent, a crosslinkable compound having at least two cross-linking substituents is preferably used. Examples of the crosslinkable compound include: melamine compounds having cross-linking substituents, such as a methylol group and a methoxymethyl group; and substituted urea compounds. Specific examples of the crosslinkable compound include compounds such as a methoxymethylated glycoluril and a methoxymethylated melamine, and examples thereof include tetramethoxymethyl glycoluril, tetrabutoxymethyl glycoluril, and hexamethoxymethyl melamine. The examples further include compounds such as tetramethoxymethyl urea and tetrabutoxymethyl urea. The cross-linking agent, if present, is used in an amount of, for example, 50% by mass or less, 0.01 to 50% by mass, or 10 to 40% by mass in the solid content.

The resist underlayer film-forming composition of the present invention may include an acid compound. Examples of the acid compound include: sulfonic acid compounds, such as p-toluenesulfonic acid, trifluoromethanesulfonic acid, and pyridinium-p-toluene sulfonate; and carboxylic acid compounds, such as salicylic acid, sulfosalicylic acid, citric acid, benzoic acid, and hydroxybenzoic acid. Examples of the acid compound further include acid generators that generate acids with heat or light, such as 2,4,4,6-tetrabromo cyclohexadienone, benzoin tosylate, 2-nitrobenzyl tosylate, p-trifluoromethyl benzenesulfonic acid-2,4-dinitrobenzyl, and phenyl-bis(trichloromethyl)-s- triazine, and N-hydroxysuccinimide trifluoromethanesulfonate. Examples of the acid compound still further include: iodonium salt acid generators, such as diphenyliodonium hexafluorophosphate, diphenyliodonium trifluoromethanesulfonate, and bis(4-tert-butylphenyl)iodonium trifluoromethanesulfonate; and sulfonium salt acid generators, such as triphenylsulfonium hexafluoroantimonate and triphenylsulfonium trifluoromethanesulfonate. As an acid compound, a sulfonic acid compound, an iodonium salt acid generator, or a sulfonium salt acid generator is preferably used. These acid compounds may be used alone, or two or more of them may be used in combination. The acid compound is present in an amount of, for example, 0.1 to 10% by mass, or 0.1 to 5% by mass in the solid content.

The resist underlayer film-forming composition of the present invention may include a curing catalyst. The curing catalyst works when a coating film containing polyorganosiloxane composed of the hydrolyzed condensate is heated and cured.

As a curing catalyst, an ammonium salt, a cyclic ammonium compound, a cyclic amine compound, or a sulfonium compound can be used.

The curing catalyst is used in an amount of 0.01 to 10 parts by mass, or 0.01 to 5 parts by mass, or 0.01 to 3 parts by mass relative to 100 parts by mass of polyorganosiloxane.

Examples of a rheology modifier include: phthalic acid compounds, such as dimethyl phthalate, diethyl phthalate, diisobutyl phthalate, dihexyl phthalate, and butyl isodecyl phthalate; adipic acid compounds, such as di normal butyl adipate, diisobutyl adipate, diisooctyl adipate, and octyl decyl adipate; maleic acid compounds, such as di normal butyl maleate, diethyl maleate, and dinonyl maleate; oleic acid compounds, such as methyl oleate, butyl oleate, and tetrahydrofurfuryl oleate; and stearic acid compounds, such as normal butyl stearate and glyceryl stearate. When the rheology modifier is used, is used in an amount of, for example, 0.001 to 10% by mass in the solid content.

Examples of the surfactant include: nonionic surfactants including polyoxyethylene alkylethers, such as polyoxyethylene lauryl ether, polyoxyethylene stearyl ether, polyoxyethylene cetyl ether, and polyoxyethylene oleyl ether; polyoxyethylene alkylallylethers, such as polyoxyethylene octyl phenol ether and polyoxyethylene nonyl phenol ether; polyoxyethylene-polyoxypropylene block copolymers; sorbitan fatty acid esters, such as sorbitan monolaurate, sorbitan monopalmitate, sorbitan monostearate, sorbitan monooleate, sorbitan trioleate, and sorbitan tristearate; and polyoxyethylene sorbitan fatty acid esters, such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorine surfactants, for example, Eftop EF301, EF303, and EF352 (trade name; manufactured by Tohkem Products Co., Ltd.), MEGAFAC F171, F173, R-08, and R-30 (trade name; manufactured by Dainippon Ink and Chemicals, Incorporated), Fluorad FC430 and FC431 (manufactured by Sumitomo 3M Limited), and AsahiGuard AG710, SURFLON S-382, SC101, SC102, SC103, SC104, SC105, and SC106 (trade name; manufactured by Asahi Glass Co., Ltd.); and organosiloxane polymer KP341 (manufactured by Shin-Etsu Chemical Co., Ltd.). These surfactants may be used alone, or two or more of them may be used in combination. When the surfactant is used, it is used in an amount of, for example, 0.0001 to 5% by mass.

A solvent used for the resist underlayer film-forming composition of the present invention is not particularly limited, provided that the solid content can be dissolved in the solvent. Examples of the solvent include: ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monoethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methyl propionate, ethoxy ethyl acetate, hydroxy ethyl acetate, methyl 2-hydroxy-3-methyl butanoate, methyl 3-methoxy propionate, ethyl 3-methoxy propionate, ethyl 3-ethoxy propionate, methyl 3-ethoxy propionate, methyl pyruvate, ethyl pyruvate, ethyl acetate, butyl acetate, ethyl lactate, and butyl lactate. These solvents may be used alone, or two or more of them may be used in combination. Further, solvents having high boiling points, such as propylene glycol monobutyl ether and propylene glycol monobutyl ether acetate can be used in combination.

A semiconductor substrate (for example, a silicon/silicon dioxide coated substrate, a silicon nitride substrate, a glass substrate, and an ITO substrate) is coated with the resist underlayer film-forming composition of the present invention by a suitable coating method such as the use of a spinner and a coater, and then the semiconductor substrate is baked to form a resist underlayer film.

As a baking condition, each of a baking temperature and a baking time is suitably selected from a range of 80 to 250° C. and a range of 0.3 to 60 minutes, respectively. Preferably, a baking temperature is 130 to 250° C., and a baking time is 0.5 to 5 minutes. A film thickness of the formed resist underlayer film is, for example, 0.01 to 3.0 µm, preferably, for example, 0.01 to 1.0 µm, or 0.01 to 0.5 µm, or 0.01 to 0.05 µm.

Next, a layer of a high energy beam resist, such as an EUV resist, is formed on the resist underlayer film. The layer of a high energy beam resist can be formed by a well-known method, i.e., applying a solution of a high energy beam resist composition onto the underlayer film, and baking the composition.

Examples of the EUV resist include resist compositions using PMMA (polymethyl methacrylate), polyhydroxy styrene, or a resin such as a phenol resin.

Subsequently, exposure to light through a given mask is performed. For exposure, EUV light (13.5 nm), an electron beam, X-ray, or the like can be used. If desired, post exposure bake (PEB) can be performed. Each of a baking temperature and a baking time for post exposure bake is suitably selected from a range of 70 to 150° C. and a range of 0.3 to 10 minutes, respectively.

Next, development is conducted with a developing solution. Examples of the developing solution include: alkaline aqueous solutions, such as an aqueous solution of an alkali metal hydroxide, such as potassium hydroxide and sodium hydroxide; an aqueous solution of quaternary ammonium hydroxide, such as tetramethylammonium hydroxide, tetraethylammonium hydroxide, and choline; and an aqueous solution of amine, such as ethanolamine, propylamine, and ethylenediamine. A surfactant and the like can further be added to the developing solution. A condition of development is suitably selected from the temperature of 5 to 50° C., and the period from 10 to 300 seconds.

In the present invention, an organic solvent can be used for a developing solution to develop a resist. Accordingly, for example, when a positive-type photoresist is used, a photoresist existed in an unexposed portion is removed to form a photoresist pattern. Examples of the developing solution include: methyl acetate, butyl acetate, ethyl acetate, isopropyl acetate, amyl acetate, isoamyl acetate, methoxy ethyl acetate, ethoxy ethyl acetate, propylene glycol monomethyl ether, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxy butyl acetate, 3-methoxy butyl acetate, 4-methoxy butyl acetate, 3-methyl-3-methoxy butyl acetate, 3-ethyl-3-methoxy butyl acetate, propylene glycol monomethyl ether acetate, propylene glycol monoethyl ether acetate, propylene glycol monopropyl ether acetate, 2-ethoxy butyl acetate, 4-ethoxy butyl acetate, 4-propoxy butyl acetate, 2-methoxy pentyl acetate, 3-methoxy pentyl acetate, 4-methoxy pentyl acetate, 2-methyl-3-methoxy pentyl acetate, 3-methyl-3-methoxy pentyl acetate, 3-methyl-4-methoxy pentyl acetate, 4-methyl-4-methoxy pentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, 2-hydroxypropionic acid methyl ester, 2-hydroxypropionic acid ethyl ester, methyl-3-methoxy propionate, ethyl-3-methoxy propionate, ethyl-3-ethoxy propionate, and propyl-3-methoxy propionate. A surfactant and the like can further be added to the developing solution. A condition of development is suitably selected from the temperature from 5 to 50° C., and the period from 10 to 600 seconds.

By using a photoresist pattern formed as such, as a protection film, removal of the resist underlayer film and processing of a semiconductor substrate are conducted. The resist underlayer film is removed with a gas, such as tetrafluoromethane, perfluorocyclobutane ($C_4F_8$), perfluoropropane ($C_3F_8$), trifluoro methane, carbon monoxide, argon, oxygen, nitrogen, sulfur hexafluoride, difluoromethane, nitrogen trifluoride, and chlorine trifluoride.

A flattening film, a gap-filling material layer, or an organic underlayer film can also be formed before the resist underlayer film of the present invention is formed on a semiconductor substrate. When the semiconductor substrate to be used has a large bump or a hole, it is preferable to form a flattening film or a gap-filling material layer.

EXAMPLES

Evaluation on Process in which Alkaline Aqueous Solution is Used as Developing Solution for Resist Synthesis Example 1

15.21 g (70 mol %) of tetraethoxysilane, 3.72 g (20 mol %) of methyltriethoxysilane, 2.07 g (10 mol %) of phenyltrimethoxysilane, and 31.49 g of acetone were charged in a 300 ml flask, and 6.95 g of 0.01 mol/l hydrochloric acid was dropped to the mixed solution while the mixed solution was stirred with a magnetic stirrer. After the addition, the flask was placed in an oil bath whose temperature was adjusted to 85° C., and the solution was warmed to reflux for 240 minutes to be reacted. The reaction solution was then cooled to room temperature, and 42.00 g of propylene glycol monomethyl ether acetate was added to the reaction solution to remove reaction by-products including ethanol and methanol, acetone, water, and hydrochloric acid, by vacuum distillation. After the solution was concentrated, a propylene glycol monomethyl ether acetate solution of a hydrolyzed condensate (polymer) was obtained. Propylene glycol monoethyl ether was added to the solution such that the solvent ratio of propylene glycol monomethyl ether acetate/propylene glycol monoethyl ether was 20/80 and the solution was adjusted to be 20% by weight in terms of the solid residue at 140° C. The obtained polymer corresponds to Formula (1-1), and the weight-average molecular weight determined by GPC was Mw 1,100 in terms of polystyrene.

Synthesis Example 2

15.21 g (70 mol %) of tetraethoxysilane, 4.65 g (25 mol %) of methyltriethoxysilane, 1.03 g (5 mol %) of phenyltrimethoxysilane, and 31.33 g of acetone were charged in a 300 ml flask, and 6.95 g of 0.01 mol/l hydrochloric acid was dropped to the mixed solution while the mixed solution was stirred with a magnetic stirrer. After the addition, the flask was placed in an oil bath whose temperature was adjusted to 85° C., and the solution was warmed to reflux for 240 minutes to be reacted. The reaction solution was then cooled to room temperature, and 42.00 g of propylene glycol monomethyl ether acetate was added to the reaction solution to remove reaction by-products including ethanol and methanol, acetone, water, and hydrochloric acid, by vacuum distillation. After the solution was concentrated, a propylene glycol monomethyl ether acetate solution of a hydrolyzed condensate (polymer) was obtained. Propylene glycol monoethyl ether was added to the solution such that the solvent ratio of propylene glycol monomethyl ether acetate/propylene glycol monoethyl ether was 20/80 and the solution was adjusted to be 20% by weight in terms of the solid residue at 140° C. The obtained polymer corresponds to Formula (1-1), and the weight-average molecular weight determined by GPC was Mw 1,300 in terms of polystyrene.

Synthesis Example 3

11.11 g (70 mol %) of tetramethoxysilane, 3.55 g (25 mol %) of methyltrimethoxysilane, 1.03 g (5 mol %) of phenyltrimethoxysilane, and 23.55 g of acetone were charged in a 300 ml flask, and 6.95 g of 0.01 mol/l hydrochloric acid was dropped to the mixed solution while the mixed solution stirred with a magnetic stirrer. After the addition, the flask was placed in an oil bath whose temperature was adjusted to 85° C., and the solution was warmed to reflux for 240 minutes to be reacted. The reaction solution was then cooled to a room temperature, and 32.00 g of propylene glycol monomethyl ether acetate was added to the reaction solution to remove methanol as a reaction by-product, acetone, water, and hydrochloric acid, by vacuum distillation. After the solution was concentrated, a propylene glycol monomethyl ether acetate solution of a hydrolyzed condensate (polymer) was obtained. Propylene glycol monoethyl ether was added to the solution such that the solvent ratio of propylene glycol monomethyl ether acetate/propylene glycol monoethyl ether was 20/80 and the solution was adjusted to be 20% by weight in terms of the solid residue at 140° C. The obtained polymer corresponds to Formula (1-1), and the weight-average molecular weight determined by GPC was Mw 1,300 in terms of polystyrene.

Synthesis Example 4

11.11 g (70 mol %) of tetramethoxysilane, 2.84 g (20 mol %) of methyltrimethoxysilane, 2.38 g (10 mol %) of 4-methoxyphenyltrimethoxysilane, and 24.50 g of acetone were charged in a 300 ml flask, and 6.95 g of 0.01 mol/l hydrochloric acid was dropped to the mixed solution while the mixed solution was stirred with a magnetic stirrer. After the addition, the flask was placed in an oil bath whose temperature was adjusted to 85° C., and the solution was warmed to reflux for 240 minutes to be reacted. The reaction solution was then cooled to room temperature, and 32.00 g of propylene glycol monomethyl ether acetate was added to the reaction solution to remove methanol as a reaction by-product, acetone, water, and hydrochloric acid, by vacuum distillation. After the solution was concentrated, a propylene glycol monomethyl ether acetate solution of a hydrolyzed condensate (polymer) was obtained. Propylene glycol monoethyl ether was added to the solution such that the solvent ratio of propylene glycol monomethyl ether acetate/propylene glycol monoethyl ether was 20/80 and the solution was adjusted to be 20% by weight in teams of the solid residue at 140° C. The obtained polymer corresponds to Formula (1-2), and the weight-average molecular weight determined by GPC was Mw 1,200 in terms of polystyrene.

Synthesis Example 5

11.11 g (70 mol %) of tetramethoxysilane, 4.26 g (30 mol %) of methyltrimethoxysilane, and 23.06 g of acetone were charged in a 300 ml flask, and 6.95 g of 0.01 mol/l hydrochloric acid was dropped to the mixed solution while the mixed solution was stirred with a magnetic stirrer. After the addition, the flask was placed in an oil bath whose temperature was adjusted to 85° C., and the solution was warmed to reflux for 240 minutes to be reacted. The reaction solution was then cooled to room temperature, and 30.00 g of propylene glycol monomethyl ether acetate was added to the reaction solution to remove methanol as a reaction by-product, acetone, water, and hydrochloric acid, by vacuum distillation. After the solution was concentrated, a propylene glycol monomethyl ether acetate solution of a hydrolyzed condensate (polymer) was obtained. Propylene glycol monoethyl ether was added to the solution such that the solvent ratio of propylene glycol monomethyl ether acetate/propylene glycol monoethyl ether was 20/80 and the solution was adjusted to be 20% by weight in terms of the solid residue at 140° C. The obtained polymer corresponds to Formula (1-9), and the weight-average molecular weight determined by GPC was Mw 1,300 in terms of polystyrene.

Synthesis Example 6

24.58 g (70 mol %) of tetraethoxysilane, 6.01 g (20 mol %) of triethoxy methyl silane, 4.91 g of N-(3-(triethoxysilyl)propyl)butyl amide, and 53.26 g of acetone were charged in a 300 ml flask, and 11.23 g of 0.01 mol/l hydrochloric acid was dropped to the mixed solution while the mixed solution was stirred with a magnetic stirrer. After the addition, the flask was placed in an oil bath whose temperature was adjusted to 85° C., and the solution was warmed to reflux for 240 minutes to be reacted. The reaction solution was then cooled to room temperature, and 68.00 g of propylene glycol monomethyl ether acetate was added to the reaction solution to remove methanol as a reaction by-product, acetone, water, and hydrochloric acid, by vacuum distillation. After the solution was concentrated, a propylene glycol monomethyl ether acetate solution of a hydrolyzed condensate (polymer) was obtained. Propylene glycol monoethyl ether was added to the solution such that the solvent ratio of propylene glycol monomethyl ether acetate/propylene glycol monoethyl ether was 20/80 and the solution was adjusted to be 20% by weight in terms of the solid residue at 140° C. The obtained polymer corresponds to Formula (B-1), and the weight-average molecular weight determined by GPC was Mw 2,000 in terms of polystyrene.

Synthesis Example 7

23.34 g (70 mol %) of tetraethoxysilane, 5.71 g (20 mol %) of triethoxy methyl silane, 6.68 g of heptafluoro-N-(3-(triethoxysilyl)propyl)butane amide, and 53.60 g of acetone were charged in a 300 ml flask, and 10.67 g of 0.01 mol/l hydrochloric acid was dropped to the mixed solution while the mixed solution was stirred with a magnetic stirrer. After the addition, the flask was placed in an oil bath whose temperature was adjusted to 85° C., and the solution was warmed to reflux for 240 minutes to be reacted. The reaction solution was then cooled to room temperature, and 68.00 g of propylene glycol monomethyl ether acetate was added to the reaction solution to remove methanol as a reaction by-product, acetone, water, and hydrochloric acid, by vacuum distillation. After the solution was concentrated, a propylene glycol monomethyl ether acetate solution of a hydrolyzed condensate (polymer) was obtained. Propylene glycol monoethyl ether was added to the solution such that the solvent ratio of propylene glycol monomethyl ether acetate/propylene glycol monoethyl ether was 20/80 and the solution was adjusted to be 20% by weight in terms of the solid residue at 140° C. The obtained polymer corresponds to Formula (B-2), and the weight-average molecular weight determined by GPC was Mw 2,000 in terms of polystyrene.

Synthesis Example 8

24.81 g (70 mol %) of tetraethoxysilane, 7.58 g (25 mol %) of triethoxy methyl silane, 3.08 g of N-(3-(triethoxysilyl)propyl)benzenesulfonamide, and 53.20 g of acetone were charged in a 300 ml flask, and 11.34 g of 0.01 mol/l hydrochloric acid was dropped to the mixed solution while the mixed solution was stirred with a magnetic stirrer. After the addition, the flask was placed in an oil bath whose temperature was adjusted to 85° C., and the solution was warmed to reflux for 240 minutes to be reacted. The reaction solution was then cooled to a room temperature, and 68.00 g of propylene glycol monomethyl ether acetate was added to the reaction solution to remove methanol as a reaction by-product, acetone, water, and hydrochloric acid, by vacuum distillation. After the solution was concentrated, a propylene glycol monomethyl ether acetate solution of a hydrolyzed condensate (polymer) was obtained. Propylene glycol monoethyl ether was added to the solution such that the solvent ratio of propylene glycol monomethyl ether acetate/propylene glycol monoethyl ether was 20/80 and the solution was adjusted to be 20% by weight in terms of the solid residue at 140° C. The obtained polymer corresponds to Formula (B-3), and the weight-average molecular weight determined by GPC was Mw 2,000 in terms of polystyrene.

Synthesis Example 9

24.21 g (70 mol %) of tetraethoxysilane, 5.92 g (20 mol %) of triethoxy methyl silane, 5.44 g of N-(3-(triethoxysilyl)propyl)propanesulfonamide, and 53.36 g of acetone were charged in a 300 ml flask, and 11.06 g of 0.01 mol/l hydrochloric acid was dropped to the mixed solution while the mixed solution was stirred with a magnetic stirrer. After the addition, the flask was placed in an oil bath whose temperature was adjusted to 85° C., and the solution was warmed to reflux for 240 minutes to be reacted. The reaction solution was then cooled to room temperature, and 68.00 g of propylene glycol monomethyl ether acetate was added to the reaction solution to remove methanol as a reaction by-product, acetone, water, and hydrochloric acid, by vacuum distillation. After the solution was concentrated, a propylene glycol monomethyl ether acetate solution of a hydrolyzed condensate (polymer) was obtained. Propylene glycol monoethyl ether was added to the solution such that the solvent ratio of propylene glycol monomethyl ether acetate/propylene glycol monoethyl ether was 20/80 and the condensate was adjusted to be 20% by weight in terms of the solid residue at 140° C. The obtained polymer corresponds to Formula (B-4), and the weight-average molecular weight determined by GPC was Mw 2,000 in terms of polystyrene.

Synthesis Example 10

24.87 g (70 mol %) of tetraethoxysilane, 6.08 g (20 mol %) of triethoxy methyl silane, 4.51 g of 1-propyl-3-(3-(trimethoxysilyl)propyl)urea, and 53.18 g of acetone were charged in a 300 ml flask, and 11.36 g of 0.01 mol/l hydrochloric acid was dropped to the mixed solution while the mixed solution was stirred with a magnetic stirrer. After the addition, the flask was placed in an oil bath whose temperature was adjusted to 85° C., and the solution was warmed to reflux for 240 minutes to be reacted. The reaction solution was then cooled to room temperature, and 68.00 g of propylene glycol monomethyl ether acetate was added to the reaction solution to remove methanol as a reaction by-product, acetone, water, and hydrochloric acid, by vacuum distillation. After the solution was concentrated, a propylene glycol monomethyl ether acetate solution of a hydrolyzed condensate (polymer) was obtained. Propylene glycol monoethyl ether was added to the solution such that the solvent ratio of propylene glycol monomethyl ether acetate/propylene glycol monoethyl ether was 20/80 and the solution was adjusted to be 20% by weight in terms of the solid residue at 140° C. The obtained polymer corresponds to Formula (B-5), and the weight-average molecular weight determined by GPC was Mw 2,000 in terms of polystyrene.

Synthesis Example 11

23.38 g (70 mol %) of tetraethoxysilane, 5.72 g (20 mol %) of triethoxy methyl silane, 6.63 g of 3-(triethoxysilyl)propyl diallyl isocyanurate, and 53.59 g of acetone were charged in a 300 ml flask, and 10.68 g of 0.01 mol/l hydrochloric acid was dropped to the mixed solution while the mixed solution was stirred with a magnetic stirrer. After the addition, the flask was placed in an oil bath whose temperature was adjusted to 85° C., and the solution was warmed to reflux for 240 minutes to be reacted. The reaction solution was then cooled to room temperature, and 68.00 g of propylene glycol monomethyl ether acetate was added to the reaction solution to remove methanol as a reaction by-product, acetone, water, and hydrochloric acid, by vacuum distillation. After the solution was concentrated, a propylene glycol monomethyl ether acetate solution of a hydrolyzed condensate (polymer) was obtained. Propylene glycol monoethyl ether was added to the solution such that the solvent ratio of propylene glycol monomethyl ether acetate/propylene glycol monoethyl ether was 20/80, and the solution was adjusted to be 20% by weight in terms of the solid residue at 140° C. The obtained polymer corresponds to Formula (B-6), and the weight-average molecular weight determined by GPC was Mw 2,000 in terms of polystyrene.

Synthesis Example 12

23.95 g (70 mol %) of tetraethoxysilane, 5.86 g (20 mol %) of triethoxy methyl silane, 5.82 g of the monomer of Formula (b-1-8), and 53.43 g of acetone were charged in a 300 ml flask, and 10.94 g of 0.01 mol/l hydrochloric acid was dropped to the mixed solution while the mixed solution was stirred with a magnetic stirrer. After the addition, the flask was placed in an oil bath whose temperature was adjusted to 85° C., and the solution was warmed to reflux for 240 minutes to be reacted. The reaction solution was then cooled to room temperature, and 68.00 g of propylene glycol monomethyl ether acetate was added to the reaction solution to remove methanol as a reaction by-product, acetone, water, and hydrochloric acid, by vacuum distillation. After the solution was concentrated, a propylene glycol monomethyl ether acetate solution of a hydrolyzed condensate (polymer) was obtained. Propylene glycol monoethyl ether was added to the solution such that the solvent ratio of propylene glycol monomethyl ether acetate/propylene glycol monoethyl ether was 20/80 and the solution was adjusted to be 20% by weight in terms of the solid residue at 140° C. The obtained polymer corresponds to Formula (B-7), and the weight-average molecular weight determined by GPC was Mw 2,000 in terms of polystyrene.

Synthesis Example 13

23.90 g (70 mol %) of tetraethoxysilane, 5.84 g (20 mol %) of triethoxy methyl silane, 5.89 g of the monomer of Formula (b-1-9), and 53.45 g of acetone were charged in a 300 ml flask, and 10.92 g of 0.01 mol/l hydrochloric acid was dropped to the mixed solution while the mixed solution was stirred with a magnetic stirrer. After the addition, the flask was placed in an oil bath whose temperature was adjusted to 85° C., and the solution was warmed to reflux for 240 minutes to be reacted. The reaction solution was then cooled to room temperature, and 68.00 g of propylene glycol monomethyl ether acetate was added to the reaction solution to remove methanol as a reaction by-product, acetone, water, and hydrochloric acid, by vacuum distillation. After the solution was concentrated, a propylene glycol monomethyl ether acetate solution of a hydrolyzed condensate (polymer) was obtained. Propylene glycol monoethyl ether was added to the solution such that the solvent ratio of propylene glycol monomethyl ether acetate/propylene glycol monoethyl ether was 20/80 and the solution was adjusted to be 20% by weight in terms of the solid residue at 140° C. The obtained polymer corresponds to Formula (B-8), and the weight-average molecular weight determined by GPC was Mw 2,000 in terms of polystyrene.

Synthesis Example 14

24.46 g (70 mol %) of tetraethoxysilane, 5.98 g (20 mol %) of triethoxy methyl silane, 5.09 g of the monomer of Formula (b-1-10), and 53.29 g of acetone were charged in a 300 ml flask, and 11.18 g of 0.01 mol/l hydrochloric acid was dropped to the mixed solution while the mixed solution was stirred with a magnetic stirrer. After the addition, the flask was placed in an oil bath whose temperature was adjusted to 85° C., and the solution was warmed to reflux for 240 minutes to be reacted. The reaction solution was then cooled to room temperature, and 68.00 g of propylene glycol monomethyl ether acetate was added to the reaction solution to remove methanol as a reaction by-product, acetone, water, and hydrochloric acid, by vacuum distillation. After the solution was concentrated, a propylene glycol monomethyl ether acetate solution of a hydrolyzed condensate (polymer) was obtained. Propylene glycol monoethyl ether was added to the solution such that the solvent ratio of propylene glycol monomethyl ether acetate/propylene glycol monoethyl ether was 20/80 and the solution was adjusted to be 20% by weight in terms of the solid residue at 140° C. The obtained polymer corresponds to Formula (B-9), and the weight-average molecular weight determined by GPC was Mw 2,000 in terms of polystyrene.

Synthesis Example 15

24.31 g (70 mol %) of tetraethoxysilane, 5.94 g (20 mol %) of triethoxy methyl silane, 5.31 g of N-(5-(trimethoxysilyl)-2-aza-1-oxopentyl)-caprolactam (Formula (b-1-11)), and 53.37 g of acetone were charged in a 300 ml flask, and 11.11 g of 0.01 mol/l hydrochloric acid was dropped to the mixed solution while the mixed solution was stirred with a magnetic stirrer. After the addition, the flask was placed in an oil bath whose temperature was adjusted to 85° C., and the solution was warmed to reflux for 240 minutes to be reacted. The reaction solution was then cooled to room temperature, and 68.00 g of propylene glycol monomethyl ether acetate was added to the reaction solution to remove methanol as a reaction by-product, acetone, water, and hydrochloric acid, by vacuum distillation. After the solution was concentrated, a propylene glycol monomethyl ether acetate solution of a hydrolyzed condensate (polymer) was obtained. Propylene glycol monoethyl ether was added to the solution, so that the solvent ratio of propylene glycol monomethyl ether acetate/propylene glycol monoethyl ether was 20/80 and the solution was adjusted to be 20% by weight in terms of the solid residue at 140° C. The obtained polymer corresponds to Formula (B-10), and the weight-average molecular weight determined by GPC was Mw 2,000 in terms of polystyrene.

Synthesis Example 16

23.81 g (70 mol %) of tetraethoxysilane, 5.82 g (20 mol %) of triethoxy methyl silane, 6.02 g of (S)—N-1-phenyl-ethyl-N-triethoxysilyl propyl urea (Formula (b-1-12)), and 53.47 g of acetone were charged in a 300 ml flask, and 10.88 g of 0.01 mol/l hydrochloric acid was dropped to the mixed solution while the mixed solution was stirred with a magnetic stirrer. After the addition, the flask was placed in an oil bath whose temperature was adjusted to 85° C., and the solution was warmed to reflux for 240 minutes to be reacted. The reaction solution was then cooled to room temperature, and 68.00 g of propylene glycol monomethyl ether acetate was added to the reaction solution to remove methanol as a reaction by-product, acetone, water, and hydrochloric acid, by vacuum distillation. After the solution was concentrated, a propylene glycol monomethyl ether acetate solution of a hydrolyzed condensate (polymer) was obtained. Propylene glycol monoethyl ether was added to the solution such that the solvent ratio of propylene glycol monomethyl ether acetate/propylene glycol monoethyl ether was 20/80 and the solution was adjusted to be 20% by weight in terms of the solid residue at 140° C. The obtained polymer corresponds to Formula (B-11), and the weight-average molecular weight determined by GPC was Mw 2,000 in terms of polystyrene.

Synthesis Example 17

23.46 g (70 mol %) of tetraethoxysilane, 2.87 g (20 mol %) of triethoxy methyl silane, 9.38 g of N-(3-(triethoxysilyl) propyl)butyl amide, and 53.57 g of acetone were charged in a 300 ml flask, and 10.72 g of 0.01 mol/l hydrochloric acid was dropped to the mixed solution while the mixed solution was stirred with a magnetic stirrer. After the addition, the flask was placed in an oil bath whose temperature was adjusted to 85° C., and the solution was warmed to reflux for 240 minutes to be reacted. The reaction solution was then cooled to room temperature, and 68.00 g of propylene glycol monomethyl ether acetate was added to the reaction solution to remove methanol as a reaction by-product, acetone, water, and hydrochloric acid, by vacuum distillation. After the solution was concentrated, a propylene glycol monomethyl ether acetate solution of a hydrolyzed condensate (polymer) was obtained. Propylene glycol monoethyl ether was added to the solution such that the solvent ratio of propylene glycol monomethyl ether acetate/propylene glycol monoethyl ether was 20/80 and the solution was adjusted to be 20% by weight in terms of the solid residue at 140° C. The obtained polymer corresponds to Formula (B-1), and the weight-average molecular weight determined by GPC was Mw 2,000 in terms of polystyrene.

Synthesis Example 18

21.37 g (70 mol %) of tetraethoxysilane, 2.61 g (10 mol %) of triethoxy methyl silane, 12.12 g of 3-(triethoxysilyl) propyl diallyl isocyanurate, and 54.14 g of acetone were charged in a 300 ml flask, and 9.76 g of 0.01 mol/l hydrochloric acid was dropped to the mixed solution while the mixed solution was stirred with a magnetic stirrer. After the addition, the flask was placed in an oil bath whose temperature was adjusted to 85° C., and the solution was warmed to reflux for 240 minutes to be reacted. The reaction solution was then cooled to room temperature, and 68.00 g of propylene glycol monomethyl ether acetate was added to the reaction solution to remove methanol as a reaction by-product, acetone, water, and hydrochloric acid, by vacuum distillation. After the solution was concentrated, a propylene glycol monomethyl ether acetate solution of a hydrolyzed condensate (polymer) was obtained. Propylene glycol monoethyl ether was added to the solution such that the solvent ratio of propylene glycol monomethyl ether acetate/propylene glycol monoethyl ether was 20/80 and the solution was adjusted to be 20% by weight in terms of the solid residue at 140° C. The obtained polymer corresponds to by Formula (B-6), and the weight-average molecular weight determined by GPC was Mw 2,000 in terms of polystyrene.

Synthesis Example 19

22.33 g (70 mol %) of tetraethoxysilane, 2.73 g (10 mol %) of triethoxy methyl silane, 10.86 g of the monomer of Formula (b-1-8), and 53.88 g of acetone were charged in a 300 ml flask, and 10.20 g of 0.01 mol/l hydrochloric acid was dropped to the mixed solution while the mixed solution was stirred with a magnetic stirrer. After the addition, the flask was placed in an oil bath whose temperature was adjusted to 85° C., and the solution was warmed to reflux for 240 minutes to be reacted. The reaction solution was then cooled to room temperature, and 68.00 g of propylene glycol monomethyl ether acetate was added to the reaction solution to remove methanol as a reaction by-product, acetone, water, and hydrochloric acid, by vacuum distillation. After the solution was concentrated, a propylene glycol monomethyl ether acetate solution of a hydrolyzed condensate (polymer) was obtained. Propylene glycol monomethyl ether was added to the solution such that the solvent ratio of propylene glycol monomethyl ether acetate/propylene glycol monoethyl ether was 20/80 and the solution was adjusted to be 20% by weight in terms of the solid residue at 140° C. The obtained polymer corresponds to Formula (B-7), and the weight-average molecular weight determined by GPC was Mw 2,000 in terms of polystyrene.

Synthesis Example 20

23.24 g (70 mol %) of tetraethoxysilane, 2.84 g (10 mol %) of triethoxy methyl silane, 9.67 g of the monomer of Formula (b-1-10), and 53.63 g of acetone were charged in a 300 ml flask, and 10.62 g of 0.01 mol/l hydrochloric acid was dropped to the mixed solution while the mixed solution was stirred with a magnetic stirrer. After the addition, the flask was placed in an oil bath whose temperature was adjusted to 85° C., and the solution was warmed to reflux for 240 minutes to be reacted. The reaction solution was then cooled to room temperature, and 68.00 g of propylene glycol monomethyl ether acetate was added to the reaction solution to remove methanol as a reaction by-product, acetone, water, and hydrochloric acid, by vacuum distillation. After the solution was concentrated, a propylene glycol monomethyl ether acetate solution of a hydrolyzed condensate (polymer) was obtained. Propylene glycol monoethyl ether was added to the solution such that the solvent ratio of propylene glycol monomethyl ether acetate/propylene glycol monoethyl ether was 20/80 and the solution was adjusted to be 20% by weight in terms of the solid residue at 140° C. The obtained polymer corresponds to Formula (B-9), and the weight-average molecular weight determined by GPC was Mw 2,000 in terms of polystyrene.

Synthesis Example 21

22.97 g (70 mol %) of tetraethoxysilane, 2.81 g (10 mol %) of triethoxy methyl silane, 10.03 g of N-(5-(trimethoxysilyl)-2-aza-1-oxopentyl)-caprolactam (Formula (b-1-11), and 53.70 g of acetone were charged in a 300 ml flask, and 10.49 g of 0.01 mol/l hydrochloric acid was dropped to the mixed solution while the mixed solution was stirred with a magnetic stirrer. After the addition, the flask was placed in an oil bath whose temperature was adjusted to 85° C., and the solution was warmed to reflux for 240 minutes to be reacted. The reaction solution was then cooled to room temperature, and 68.00 g of propylene glycol monomethyl ether acetate was added to the reaction solution to remove methanol as a reaction by-product, acetone, water, and hydrochloric acid, by vacuum distillation. After the solution was concentrated, a propylene glycol monomethyl ether acetate solution of a hydrolyzed condensate (polymer) was obtained. Propylene glycol monoethyl ether was added to the solution such that the solvent ratio of propylene glycol monomethyl ether acetate/propylene glycol monoethyl ether was 20/80 and the solution was adjusted to be 20% by weight in terms of the solid residue at 140° C. The obtained polymer corresponds to Formula (B-10), and the weight-average molecular weight determined by GPC was Mw 2,000 in terms of polystyrene.

Synthesis Example 22

22.44 g (70 mol %) of tetraethoxysilane, 13.46 g of N-(3-(triethoxysilyl)propyl)butyl amide, and 53.85 g of acetone were charged in a 300 ml flask, and 10.25 g of 0.01 mol/l hydrochloric acid was dropped to the mixed solution while the mixed solution was stirred with a magnetic stirrer. After the addition, the flask was placed in an oil bath whose temperature was adjusted to 85° C., and the solution was warmed to reflux for 240 minutes to be reacted. The reaction solution was cooled to room temperature, and 68.00 g of propylene glycol monomethyl ether acetate was added to the reaction solution to remove methanol as a reaction by-product, acetone, water, and hydrochloric acid, by vacuum distillation. After the solution was concentrated, a propylene glycol monomethyl ether acetate solution of a hydrolyzed condensate (polymer) was obtained. Propylene glycol monoethyl ether was added to the solution such that the solvent ratio of propylene glycol monomethyl ether acetate/propylene glycol monoethyl ether was 20/80 and the solution was adjusted to be 20% by weight in terms of the solid residue at 140° C. The obtained polymer corresponds to by Formula (B-12), and the weight-average molecular weight determined by GPC was Mw 2,000 in terms of polystyrene.

Synthesis Example 23

19.67 g (70 mol %) of tetraethoxysilane, 16.73 g of 3-(triethoxysilyl)propyl diallyl isocyanurate, and 54.61 g of acetone were charged in a 300 ml flask, and 8.99 g of 0.01 mol/l hydrochloric acid was dropped to the mixed solution while the mixed solution was stirred with a magnetic stirrer. After the addition, the flask was placed in an oil bath whose temperature was adjusted to 85° C., and the solution was warmed to reflux for 240 minutes to be reacted. The reaction solution was then cooled to room temperature, and 68.00 g of propylene glycol monomethyl ether acetate was added to the reaction solution to remove methanol as a reaction by-product, acetone, water, and hydrochloric acid, by vacuum distillation. After the solution was concentrated, a propylene glycol monomethyl ether acetate solution of a hydrolyzed condensate (polymer) was obtained. Propylene glycol monoethyl ether was added to the solution such that the solvent ratio of propylene glycol monomethyl ether acetate/propylene glycol monoethyl ether was 20/80 and the solution was adjusted to be 20% by weight in terms of the solid residue at 140° C. The obtained polymer corresponds to Formula (B-13), and the weight-average molecular weight determined by GPC was Mw 2,000 in terms of polystyrene.

Synthesis Example 24

20.92 g (70 mol %) of tetraethoxysilane, 15.26 g of the monomer of Formula (b-1-8), and 54.26 g of acetone were charged in a 300 ml flask, and 9.56 g of 0.01 mol/l hydrochloric acid was dropped to the mixed solution while the mixed solution was stirred with a magnetic stirrer. After the addition, the flask was placed in an oil bath whose temperature was adjusted to 85° C., and the solution was warmed to reflux for 240 minutes to be reacted. The reaction solution was then cooled to room temperature, and 68.00 g of propylene glycol monomethyl ether acetate was added to the reaction solution to remove methanol as a reaction by-product, acetone, water, and hydrochloric acid, by vacuum distillation. After the solution was concentrated, a propylene glycol monomethyl ether acetate solution of a hydrolyzed condensate (polymer) was obtained. Propylene glycol monoethyl ether was added to the solution such that the solvent ratio of propylene glycol monomethyl ether acetate/propylene glycol monoethyl ether was 20/80 and the solution was adjusted to be 20% by weight in terms of the solid residue at 140° C. The obtained polymer corresponds to Formula (B-14), and the weight-average molecular weight determined by GPC was Mw 2,000 in terms of polystyrene.

Synthesis Example 25

22.14 g (70 mol %) of tetraethoxysilane, 13.82 g of the monomer of Formula (b-1-10), and 53.93 g of acetone were charged in a 300 ml flask, and 10.12 g of 0.01 mol/l hydrochloric acid was dropped to the mixed solution while the mixed solution was stirred with a magnetic stirrer. After the addition, the flask was placed in an oil bath whose temperature was adjusted to 85° C., and the solution was warmed to reflux for 240 minutes to be reacted. The reaction solution was then cooled to room temperature, and 68.00 g of propylene glycol monomethyl ether acetate was added to the reaction solution to remove methanol as a reaction by-product, acetone, water, and hydrochloric acid, by vacuum distillation. After the solution was concentrated, a propylene glycol monomethyl ether acetate solution of a hydrolyzed condensate (polymer) was obtained. Propylene glycol monoethyl ether was added to the solution such that the solvent ratio of propylene glycol monomethyl ether acetate/propylene glycol monoethyl ether was 20/80 and the solution was adjusted to be 20% by weight in terms of the solid residue at 140° C. The obtained polymer corresponds to Formula (B-14-2), and the weight-average molecular weight determined by GPC was Mw 2,000 in terms of polystyrene.

Synthesis Example 26

21.76 g (70 mol %) of tetraethoxysilane, 14.26 g of N-(5-(trimethoxysilyl)-2-aza-1-oxopentyl)-caprolactam (Formula (b-1-11)), and 54.03 g of acetone were charged in a 300 ml flask, and 9.95 g of 0.01 mol/l hydrochloric acid was dropped to the mixed solution while the mixed solution was stirred with a magnetic stirrer. After the addition, the flask was placed in an oil bath whose temperature was adjusted to 85° C., and the solution was warmed to reflux for 240 minutes to be reacted. The reaction solution was then cooled to room temperature, and 68.00 g of propylene glycol monomethyl ether acetate was added to the reaction solution to remove methanol as a reaction by-product, acetone, water, and hydrochloric acid, by vacuum distillation. After the solution was concentrated, a propylene glycol monomethyl ether acetate solution of a hydrolyzed condensate (polymer) was obtained. Propylene glycol monoethyl ether was added to the solution such that the solvent ratio of propylene glycol monomethyl ether acetate/propylene glycol monoethyl ether was 20/80 and the solution was adjusted to be 20% by weight in terms of the solid residue at 140° C. The obtained polymer corresponds to Formula (B-15), and the weight-average molecular weight determined by GPC was Mw 2,000 in terms of polystyrene.

Synthesis Example 27

25.59 g (70 mol %) of tetraethoxysilane, 6.26 g of triethoxy methyl silane, 3.48 g of phenyltrimethoxysilane, and 52.98 g of acetone were charged in a 300 ml flask, and 11.69 g of 0.01 mol/l hydrochloric acid was dropped to the mixed solution while the mixed solution was stirred with a magnetic stirrer. After the addition, the flask was placed in an oil bath whose temperature was adjusted to 85° C., and the solution was warmed to reflux for 240 minutes to be reacted. The reaction solution was then cooled to room temperature, and 68.00 g of propylene glycol monomethyl ether acetate was added to the reaction solution to remove methanol as a reaction by-product, acetone, water, and hydrochloric acid, by vacuum distillation. After the solution was concentrated, a propylene glycol monomethyl ether acetate solution of a hydrolyzed condensate (polymer) was obtained. Propylene glycol monoethyl ether was added to the solution such that the solvent ratio of propylene glycol monomethyl ether acetate/propylene glycol monoethyl ether was 20/80 and the solution was adjusted to be 20% by weight in terms of the solid residue at 140° C. The obtained polymer corresponds to Formula (1-1), and the weight-average molecular weight determined by GPC was Mw 2,000 in terms of polystyrene.

Comparative Synthesis Example 1

25.25 g (70 mol %) of tetraethoxysilane, 6.18 g (20 mol %) of triethoxy methyl silane, 3.95 g (10 mol %) of [4-(methoxymethoxy)phenyl]trimethoxysilane, and 53.08 g of acetone were charged in a 300 ml flask, and 11.54 g of 0.01 mol/l hydrochloric acid was dropped to the mixed solution while the mixed solution was stirred with a magnetic stirrer. After the addition, the flask was placed in an oil bath whose temperature was adjusted to 85° C., and the solution was warmed to reflux for 240 minutes to be reacted. The reaction solution was then cooled to room temperature, and 68.00 g of propylene glycol monomethyl ether acetate was added to the reaction solution to remove methanol as a reaction by-product, acetone, water, and hydrochloric acid, by vacuum distillation. After the solution was concentrated, a propylene glycol monomethyl ether acetate solution of a hydrolyzed condensate (polymer) was obtained. Propylene glycol monoethyl ether was added to the solution such that the solvent ratio of propylene glycol monomethyl ether acetate/propylene glycol monoethyl ether was 20/80 and the solution was adjusted to be 20% by weight in terms of the solid residue at 140° C. The weight-average molecular weight of the obtained polymer determined by GPC was Mw 2,000 in terms of polystyrene.

(Preparation of Si-Containing Resist Underlayer Film)

The silicon-containing polymer obtained in each of Synthesis Examples 1 to 5, an acid, a curing catalyst, a solvent, and water were mixed according to the mixing ratio shown in Table 1, and each of the resist underlayer film-forming compositions was prepared. The addition ratios of the polymers shown in Table 1 represent addition amounts of polymers themselves, and do not represent addition amounts of polymer solutions.

The abbreviations in Table 1 are explained below: MA is maleic acid, BTEAC is benzyltriethylammonium chloride, IMIDTEOS is N-(3-triethoxysilylpropyl)-4,5-dihydroimidazole, TPSCl is triphenylsulfonium chloride, TPSMA is monotriphenylsulfonium maleate, PGMEA is propylene glycol monomethyl ether acetate, PGEE is propylene glycol monoethyl ether, and PGME is propylene glycol monomethyl ether.

The further abbreviations in Table 1 are explained below Amide TEOS is N-(3-(triethoxysilyl)propyl)butyl amide, Famide TEOS is heptafluoro-N-(3-(triethoxysilyl)propyl) butane amide, BSA is N-(3-(triethoxysilyl)propyl)benzenesulfonamide, PrSA is N-(3-(triethoxysilyl)propyl)propanesulfonamide, Urea TMOS is 1-(3-(trimethoxysilyl)propyl) urea, Prurea TMOS is 1-propyl-3-(3-(trimethoxysilyl) propyl)urea, and DAICATEOS is 3-(triethoxysilyl)propyl diallyl isocyanurate. The water used was ultrapure water. Each of the addition amounts is expressed in parts by mass.

TABLE 1

| | Polymer | Acid | Curing Catalyst | Silane Monomer | Solvent | | | |
|---|---|---|---|---|---|---|---|---|
| Example 1 | Synthesis Example 1 | MA | IMIDTEOS | Amide TEOS | PGME | PGEE | PGMEA | Water |
| (Parts by mass) | 2 | 0.02 | 0.02 | 0.2 | 10 | 80 | 3 | 7 |
| Example 2 | Synthesis Example 1 | MA | IMIDTEOS | Famide TEOS | PGME | PGEE | PGMEA | Water |
| (Parts by mass) | 2 | 0.02 | 0.02 | 0.2 | 10 | 80 | 3 | 7 |
| Example 3 | Synthesis Example 1 | MA | IMIDTEOS | BSA | PGME | PGEE | PGMEA | Water |
| (Parts by mass) | 2 | 0.02 | 0.02 | 0.2 | 10 | 80 | 3 | 7 |
| Example 4 | Synthesis Example 1 | MA | IMIDTEOS | PrSA | PGME | PGEE | PGMEA | Water |
| (Parts by mass) | 2 | 0.02 | 0.02 | 0.2 | 10 | 80 | 3 | 7 |
| Example 5 | Synthesis Example 1 | MA | IMIDTEOS | UreaTMOS | PGME | PGEE | PGMEA | Water |
| (Parts by mass) | 2 | 0.02 | 0.02 | 0.2 | 10 | 80 | 3 | 7 |
| Example 6 | Synthesis Example 1 | MA | IMIDTEOS | PrureaTMOS | PGME | PGEE | PGMEA | Water |
| (Parts by mass) | 2 | 0.02 | 0.02 | 0.2 | 10 | 80 | 3 | 7 |
| Example 7 | Synthesis Example 1 | MA | IMIDTEOS | DAICATEOS | PGME | PGEE | PGMEA | Water |
| (Parts by mass) | 2 | 0.02 | 0.02 | 0.2 | 10 | 80 | 3 | 7 |
| Example 8 | Synthesis Example 1 | MA | TPSMA | BSA | PGME | PGEE | PGMEA | Water |
| (Parts by mass) | 2 | 0.02 | 0.02 | 0.2 | 10 | 80 | 3 | 7 |
| Example 9 | Synthesis Example 1 | MA | TPSCl | BSA | PGME | PGEE | PGMEA | Water |
| (Parts by mass) | 2 | 0.02 | 0.02 | 0.2 | 10 | 80 | 3 | 7 |
| Example 10 | Synthesis Example 1 | MA | BTEAC | BSA | PGME | PGEE | PGMEA | Water |
| (Parts by mass) | 2 | 0.02 | 0.02 | 0.2 | 10 | 80 | 3 | 7 |
| Example 11 | Synthesis Example 2 | MA | IMIDTEOS | BSA | PGME | PGEE | PGMEA | Water |
| (Parts by mass) | 2 | 0.02 | 0.02 | 0.2 | 10 | 80 | 3 | 7 |
| Example 12 | Synthesis Example 3 | MA | IMIDTEOS | BSA | PGME | PGEE | PGMEA | Water |
| (Parts by mass) | 2 | 0.02 | 0.02 | 0.2 | 10 | 80 | 3 | 7 |
| Example 13 | Synthesis Example 4 | MA | IMIDTEOS | BSA | PGME | PGEE | PGMEA | Water |
| (Parts by mass) | 2 | 0.02 | 0.02 | 0.2 | 10 | 80 | 3 | 7 |
| Example 14 | Synthesis Example 5 | MA | IMIDTEOS | BSA | PGME | PGEE | PGMEA | Water |
| (Parts by mass) | 2 | 0.02 | 0.02 | 0.2 | 10 | 80 | 3 | 7 |
| Comparative Example 1 | Synthesis Example 1 | MA | IMIDTEOS | | PGME | PGEE | PGMEA | Water |
| (Parts by mass) | 2 | 0.02 | 0.02 | | 10 | 80 | 3 | 7 |
| Comparative Example 2 | Synthesis Example 2 | MA | IMIDTEOS | | PGME | PGEE | PGMEA | Water |
| (Parts by mass) | 2 | 0.02 | 0.02 | | 10 | 80 | 3 | 7 |
| Comparative Example 3 | Synthesis Example 3 | MA | IMIDTEOS | | PGME | PGEE | PGMEA | Water |
| (Parts by mass) | 2 | 0.02 | 0.02 | | 10 | 80 | 3 | 7 |
| Comparative Example 4 | Synthesis Example 4 | MA | IMIDTEOS | | PGME | PGEE | PGMEA | Water |
| (Parts by mass) | 2 | 0.02 | 0.02 | | 10 | 80 | 3 | 7 |
| Comparative Example 5 | Synthesis Example 5 | MA | IMIDTEOS | | PGME | PGEE | PGMEA | Water |
| (Parts by mass) | 2 | 0.02 | 0.02 | | 10 | 80 | 3 | 7 |

The silicon-containing polymer obtained in each of the Synthesis Examples, an acid, a curing catalyst, other additive(s), a solvent, and water were mixed according to the mixing ratio shown in Table 1, and then the mixture was filtrated through a fluorine resin filter having a pore size of 0.1 μm to prepare each of the resist underlayer film-forming composition solutions. The addition ratios of the polymers shown in Table 1 represent addition amounts of polymers themselves, and do not represent addition amounts of polymer solutions.

The abbreviations in Table 1 are explained below: MA is maleic acid, BTEAC is benzyltriethylammonium chloride, IMIDTEOS is N-(3-triethoxysilylpropyl)-4,5-dihydroimidazole, TPSNO3 is triphenylsulfonium nitrate, TPSCS is triphenylsulfonium camphorsulfonate, BPS is bisphenol sulfone, DPImTMOS is 6-(3-(trimethoxysilyppropyl)-5H-dibenzo[c,e]azepine-5,7(6H)-dione, NAImTEOS is 2-(3-(triethoxysilyppropyl)-1H-benzo[f]isoindole-1,3(2H)-dione, SucImTEOS is 1-(3-(triethoxysilyl)propyl)pyrrolidine-2,5-dione, CapUreaTMOS is N-(5-(trimethoxysilyl)-2-aza-1-oxopentyl)-caprolactam, PhEtUreaTEOS is (S)—N-1-phenylethyl-N-triethoxysilyl propyl urea, PGMEA is propylene glycol monomethyl ether acetate, PGEE is propylene glycol monoethyl ether, and PGME is propylene glycol monomethyl ether. The water used was ultrapure water. Each of the addition amounts is expressed in parts by mass.

TABLE 2

|  | Polymer | Acid | Curing Catalyst | Additive | | Solvent | | | |
|---|---|---|---|---|---|---|---|---|---|
| Example 15 | Synthesis Example 6 | MA | BTEAC | BPS | TPSC | PGME | PGEE | PGMEA | Water |
| (Parts by mass) | 2 | 0.06 | 0.02 | 0.1 | 0.1 | 10 | 76 | 7 | 7 |
| Example 16 | Synthesis Example 7 | MA | TPSCl | BPS | | PGME | PGEE | PGMEA | Water |
| (Parts by mass) | 2 | 0.06 | 0.02 | 0.1 | | 10 | 76 | 7 | 7 |
| Example 17 | Synthesis Example 8 | MA | TPSNO3 | TPSCS | | PGME | PGEE | PGMEA | Water |
| (Parts by mass) | 2 | 0.06 | 0.02 | 0.1 | | 10 | 76 | 7 | 7 |
| Example 18 | Synthesis Example 9 | MA | BTEAC | BPS | TPSCS | PGME | PGEE | PGMEA | Water |
| (Parts by mass) | 2 | 0.06 | 0.02 | 0.1 | 0.1 | 10 | 76 | 7 | 7 |
| Example 19 | Synthesis Example 10 | MA | TPSCl | BPS | | PGME | PGEE | PGMEA | Water |
| (Parts by mass) | 2 | 0.06 | 0.02 | 0.1 | | 10 | 76 | 7 | 7 |
| Example 20 | Synthesis Example 11 | MA | TPSNO3 | TPSCS | | PGME | PGEE | PGMEA | Water |
| (Parts by mass) | 2 | 0.06 | 0.02 | 0.1 | | 10 | 76 | 7 | 7 |
| Example 21 | Synthesis Example 12 | MA | BTEAC | BPS | TPSCS | PGME | PGEE | PGMEA | Water |
| (Parts by mass) | 2 | 0.06 | 0.02 | 0.1 | 0.1 | 10 | 76 | 7 | 7 |
| Example 22 | Synthesis Example 13 | MA | TPSCl | BPS | | PGME | PGEE | PGMEA | Water |
| (Parts by mass) | 2 | 0.06 | 0.02 | 0.1 | | 10 | 76 | 7 | 7 |
| Example 23 | Synthesis Example 14 | MA | TPSNO3 | TPSCS | | PGME | PGEE | PGMEA | Water |
| (Parts by mass) | 2 | 0.06 | 0.02 | 0.1 | | 10 | 76 | 7 | 7 |
| Example 24 | Synthesis Example 15 | MA | BTEAC | BPS | | PGME | PGEE | PGMEA | Water |
| (Parts by mass) | 2 | 0.06 | 0.02 | 0.1 | | 10 | 76 | 7 | 7 |
| Example 25 | Synthesis Example 16 | MA | TPSNO3 | TPSCS | | PGME | PGEE | PGMEA | Water |
| (Parts by mass) | 2 | 0.06 | 0.02 | 0.1 | | 10 | 76 | 7 | 7 |
| Example 26 | Synthesis Example 17 | MA | TPSNO3 | BPS | TPSCS | PGME | PGEE | PGMEA | Water |
| (Parts by mass) | 2 | 0.06 | 0.02 | 0.1 | 0.1 | 10 | 76 | 7 | 7 |
| Example 27 | Synthesis Example 18 | MA | TPSNO3 | BPS | TPSCS | PGME | PGEE | PGMEA | Water |
| (Parts by mass) | 2 | 0.06 | 0.02 | 0.1 | 0.1 | 10 | 76 | 7 | 7 |
| Example 28 | Synthesis Example 19 | MA | TPSNO3 | BPS | TPSCS | PGME | PGEE | PGMEA | Water |
| (Parts by mass) | 2 | 0.06 | 0.02 | 0.1 | 0.1 | 10 | 76 | 7 | 7 |
| Example 29 | Synthesis Example 20 | MA | TPSNO3 | BPS | TPSCS | PGME | PGEE | PGMEA | Water |

TABLE 2-continued

| | Polymer | Acid | Curing Catalyst | Additive | | | Solvent | | |
|---|---|---|---|---|---|---|---|---|---|
| (Parts by mass) | 2 | 0.06 | 0.02 | 0.1 | 0.1 | 10 | 76 | 7 | 7 |
| Example 30 | Synthesis Example 21 | MA | TPSNO3 | BPS | TPSCS | PGME | PGEE | PGMEA | Water |
| (Parts by mass) | 2 | 0.06 | 0.02 | 0.1 | 0.1 | 10 | 76 | 7 | 7 |
| Example 31 | Synthesis Example 22 | MA | TPSNO3 | BPS | TPSCS | PGME | PGEE | PGMEA | Water |
| (Parts by mass) | 2 | 0.06 | 0.02 | 0.1 | 0.1 | 10 | 76 | 7 | 7 |
| Example 32 | Synthesis Example 23 | MA | TPSNO3 | BPS | TPSCS | PGME | PGEE | PGMEA | Water |
| (Parts by mass) | 2 | 0.06 | 0.02 | 0.1 | 0.1 | 10 | 76 | 7 | 7 |
| Example 33 | Synthesis Example 24 | MA | TPSNO3 | BPS | TPSCS | PGME | PGEE | PGMEA | Water |
| (Parts by mass) | 2 | 0.06 | 0.02 | 0.1 | 0.1 | 10 | 76 | 7 | 7 |
| Example 34 | Synthesis Example 25 | MA | TPSNO3 | BPS | TPSCS | PGME | PGEE | PGMEA | Water |
| (Parts by mass) | 2 | 0.06 | 0.02 | 0.1 | 0.1 | 10 | 76 | 7 | 7 |
| Example 35 | Synthesis Example 26 | MA | TPSNO3 | BPS | TPSCS | PGME | PGEE | PGMEA | Water |
| (Parts by mass) | 2 | 0.06 | 0.02 | 0.1 | 0.1 | 10 | 76 | 7 | 7 |
| Example 36 | Synthesis Example 27 | MA | TPSNO3 | DPImTEOS | | PGME | PGEE | PGMEA | Water |
| (Parts by mass) | 2 | 0.06 | 0.02 | 0.2 | | 10 | 76 | 7 | 7 |
| Example 37 | Synthesis Example 27 | MA | TPSNO3 | NAImTEOS | | PGME | PGEE | PGMEA | Water |
| (Parts by mass) | 2 | 0.06 | 0.02 | 0.2 | | 10 | 76 | 7 | 7 |
| Example 38 | Synthesis Example 27 | MA | TPSNO3 | SucImTEOS | | PGME | PGEE | PGMEA | Water |
| (Parts by mass) | 2 | 0.06 | 0.02 | 0.2 | | 10 | 76 | 7 | 7 |
| Example 39 | Synthesis Example 27 | MA | TPSNO3 | CapUreaTMOS | | PGME | PGEE | PGMEA | Water |
| (Parts by mass) | 2 | 0.06 | 0.02 | 0.2 | | 10 | 76 | 7 | 7 |
| Example 40 | Synthesis Example 27 | MA | TPSNO3 | PhEtUreaTEOS | | PGME | PGEE | PGMEA | Water |
| (Parts by mass) | 2 | 0.06 | 0.02 | 0.2 | | 10 | 76 | 7 | 7 |
| Comparative Example 6 | Comparative Synthesis Example 1 | MA | TPSNO3 | BPS | TPSCS | PGME | PGEE | PGMEA | Water |
| (Parts by mass) | 2 | 0.02 | 0.006 | 0.1 | 0.1 | 10 | 76 | 7 | 7 |

(Organic Underlayer Film (A1 Layer))

As an organic underlayer film (A1 layer), CNp-PM (the molar ratio of the components is 60% of vinyl naphthalene: 40% of hydroxystyrene, and the weight-average molecular weight is 6,000) manufactured by Maruzen Petrochemical Co., Ltd. was used.

The case in which the thin film formed with the thin film-forming composition of the present invention was used as the resist underlayer film was evaluated, and the result will be described below.

(Measurement of Optical Constant)

Each of the resist underlayer film-forming compositions of the present invention, which were prepared in Examples 1 to 14 and Comparative Examples 1 to 5, was applied onto a silicon wafer by using a spinner. The silicon wafer was baked on a hot plate at 240° C. for 1 minute to form the resist underlayer film (having a film thickness of 0.05 μm) of the present invention. For each of these resist underlayer films, refractive indices (n values) and optical extinction coefficients (k values, also called attenuation coefficients) at the wavelengths of 193 nm and 248 nm were measured by using a spectral ellipsometer (VUV-VASE VU-302 manufactured by J. A. Woollam Co. Inc.).

TABLE 3

| | n1 | k1 | n2 | k2 |
|---|---|---|---|---|
| Example 1 | 1.68 | 0.27 | 1.56 | 0.02 |
| Example 2 | 1.68 | 0.27 | 1.56 | 0.02 |
| Example 3 | 1.68 | 0.29 | 1.57 | 0.03 |
| Example 4 | 1.68 | 0.28 | 1.56 | 0.02 |
| Example 5 | 1.68 | 0.27 | 1.57 | 0.02 |
| Example 6 | 1.68 | 0.27 | 1.56 | 0,02 |
| Example 7 | 1.68 | 0.28 | 1.56 | 0.02 |
| Example 8 | 1.68 | 0.27 | 1.56 | 0.02 |
| Example 9 | 1.68 | 0.27 | 1.56 | 0.02 |
| Example 10 | 1.68 | 0.27 | 1.56 | 0.02 |
| Example 11 | 1.62 | 0.17 | 1.52 | 0.03 |
| Example 12 | 1.61 | 0.12 | 1.52 | 0.03 |

TABLE 3-continued

|  | n1 | k1 | n2 | k2 |
|---|---|---|---|---|
| Example 13 | 1.51 | 0.27 | 1.58 | 0.02 |
| Example 14 | 1.53 | 0.00 | 1.47 | 0.00 |
| Comparative Example 1 | 1.68 | 0.27 | 1.56 | 0.02 |
| Comparative Example 2 | 1.62 | 0.17 | 1.52 | 0.03 |
| Comparative Example 3 | 1.61 | 0.12 | 1.52 | 0.03 |
| Comparative Example 4 | 1.51 | 0.27 | 1.58 | 0.02 |
| Comparative Example 5 | 1.53 | 0.00 | 1.47 | 0.00 |

[Resist Pattern Formation by EUV Exposure]

A silicon wafer was coated with the organic underlayer film (A1 layer)-forming composition, and was baked on a hot plate at 240° C. for 60 seconds to obtain an organic underlayer film (A1 layer) having a film thickness of 90 nm. On the organic under layer (A1 layer), each of the resist underlayer film-forming composition solutions, which were prepared in Examples 1 to 14 and Comparative Examples 1 to 5, was applied by spin coating and heated at 240° C. for 1 minute to form a resist underlayer film layer (B) (20 nm). On the hard mask of the resist underlayer film layer (B), a resist (a methacrylate resin resist) solution for EUV was applied by spin coating and heated to form an EUV resist layer (C). The EUV resist layer (C) was exposed to light by using an EUV exposure device (Micro Exposure Tool, abbreviated as MET) under the condition of NA=0.30, σ=0.36/0.68 Quadropole. After the exposure, PEB was performed, and then the resist film was cooled to room temperature on a cooling plate. Development with an alkaline aqueous solution (a 2.38% by mass aqueous solution of tetramethylammonium hydroxide) was performed followed by a rinse treatment to form a resist pattern. The resist pattern was evaluated according to the following criteria: a 26 nm line and space pattern was formed or not and the patterned shape was good or not as determined by the observation of the section of the pattern.

TABLE 4

|  | Pattern Formation | Pattern Shape |
|---|---|---|
| Example 1 | Possible | Good |
| Example 2 | Possible | Good |
| Example 3 | Possible | Good |
| Example 4 | Possible | Good |
| Example 5 | Possible | Good |
| Example 6 | Possible | Good |
| Example 7 | Possible | Good |
| Example 8 | Possible | Good |
| Example 9 | Possible | Good |
| Example 10 | Possible | Good |
| Example 11 | Possible | Good |
| Example 12 | Possible | Good |
| Example 13 | Possible | Good |
| Example 14 | Possible | Good |
| Comparative Example 1 | Possible | Undercut |
| Comparative Example 2 | Possible | Footing |
| Comparative Example 3 | Possible | Footing |
| Comparative Example 4 | Possible | Partially Undercut |
| Comparative Example 5 | Possible | Partially Footing |

(Preparation of Organic Resist Underlayer Film (A2 Layer))

Carbazole (6.69 g, 0.040 mol, manufactured by Tokyo Chemical Industry Co., Ltd.), 9-fluorenone (7.28 g, 0.040 mol, manufactured by Tokyo Chemical Industry Co., Ltd.), and para-toluenesulfonic acid monohydrate (0.76 g, 0.0040 mol, manufactured by Tokyo Chemical Industry Co., Ltd.) were charged in a 100 mL four-neck flask under a nitrogen gas, and then 1,4-dioxane (6.69 g, manufactured by Kanto Chemical Co., Inc.) was added thereto and stirred. The temperature was raised to 100° C. so that the content is dissolved and polymerization is initiated. After 24 hours, the content was cooled to 60° C. The content was diluted by adding chloroform (34 g, manufactured by Kanto Chemical Co., Inc.), and was re-precipitated in methanol (168 g, manufactured by Kanto Chemical Co., Inc.). The obtained precipitate was filtrated and dried in a vacuum dryer at 80° C. for 24 hours to obtain 9.37 g of the target polymer (Formula (C-1), hereinafter, abbreviated as PCzFL).

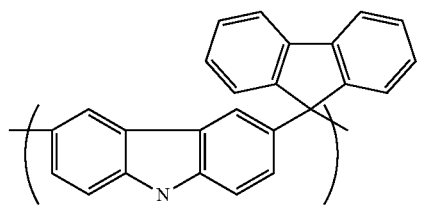

Formula (C-1)

The PCzFL was measured by 1H-NMR, and the result is shown below: 1H-NMR (400 MHz, DMSO-d6): δ7.03-7.55 (br, 12H), δ7.61-8.10 (br, 4H), 811.18 (br, 1H). The weight-average molecular weight (Mw) of PCzFL determined by GPC was 2,800 in terms of polystyrene, and polydispersity (Mw/Mn) was 1.77.

20 g of the obtained resin was mixed with 3.0 g of tetramethoxymethyl glycoluril (trade name: Powder Link 1174, manufactured by Mitsui Cytec, Ltd.) as a cross-linking agent, 0.30 g of pyridinium para-toluenesulfonate as a catalyst, and 0.06 g of MEGAFAC R-30 (trade name, manufactured by Dainippon Ink and Chemicals, Incorporated) as a surfactant, and the mixture was dissolved in 88 g of propylene glycol monomethyl ether acetate to prepare a solution. Subsequently, the solution was filtrated through a polyethylene microfilter having a pore size of 0.10 μm, followed by filtering through a polyethylene microfilter having a pore size of 0.05 μm to prepare a solution of an organic underlayer film (A2 layer)-forming composition used for a multilayer film lithography process.

(Measurement of Dry Etching Rate)

The etcher and etching gas used for measuring a dry etching rate are described below:

ES401 (manufactured by Nippon Scientific Co., Ltd.), $CF_4$; and

RIE-10NR (manufactured by SAMCO INC.), $O_2$.

Each of the solutions of Si-containing resist underlayer film-forming compositions prepared in Examples 15 to 40 and Comparative Example 6 was applied onto a silicon wafer by using a spinner. The silicon wafer was heated on a hot plate at 240° C. for 1 minute. In such a manner, Si-containing resist underlayer films (having a film thickness of 50 nm (for etching rate measurements with $CF_4$ gas and $O_2$ gas, respectively)), were formed. Similarly, on a silicon wafer, the organic underlayer film (A2 layer)-forming composition was applied by using a spinner to form a film (having a film thickness of 0.20 μm). The dry etching rate was measured by using $O_2$ gas as an etching gas, and the result was compared with each of the dry etching rates of Si-containing resist underlayer films of Examples 15 to 40 and Comparative Example 6.

Table 5 shows each of etch rates when fluorine based gas ($CF_4$ gas) was used (an etching rate is nm/minute) and each of oxygen based gas ($O_2$ gas) resistances as an etch rate ratio of (the resist underlayer film of the present invention)/(the organic underlayer film: A2 layer).

TABLE 5

|  | Fluorine based Gas Etch Rate (nm/minute) | Oxygen based Gas Resistance (vs Organic Underlayer Film A2) |
| --- | --- | --- |
| Example 15 | 22 | 0.03 |
| Example 16 | 23 | 0.04 |
| Example 17 | 22 | 0.03 |
| Example 18 | 22 | 0.03 |
| Example 19 | 22 | 0.03 |
| Example 20 | 26 | 0.05 |
| Example 21 | 22 | 0.04 |
| Example 22 | 22 | 0.04 |
| Example 23 | 22 | 0.03 |
| Example 24 | 23 | 0.03 |
| Example 25 | 23 | 0.03 |
| Example 26 | 28 | 0.08 |
| Example 27 | 22 | 0.08 |
| Example 28 | 25 | 0.04 |
| Example 29 | 27 | 0.05 |
| Example 30 | 25 | 0.05 |
| Example 31 | 32 | 0.12 |
| Example 32 | 24 | 0.10 |
| Example 33 | 28 | 0.07 |
| Example 34 | 29 | 0.08 |
| Example 35 | 23 | 0.04 |
| Example 36 | 23 | 0.04 |
| Example 37 | 23 | 0.04 |
| Example 38 | 23 | 0.04 |
| Example 39 | 23 | 0.04 |
| Example 40 | 23 | 0.04 |
| Comparative Example 6 | 21 | 0.03 |

[Resist Pattern Formation by EUV Exposure]

A silicon wafer was coated with the organic underlayer film (A2 layer)-forming composition, and was baked on a hot plate at 240° C. for 60 seconds to obtain an organic underlayer film (A2 layer) having a film thickness of 90 nm. On the organic underlayer film (A2 layer), each of the resist underlayer film-forming composition solutions, which were prepared in Examples 15 to 40 and Comparative Example 6, was applied by spin coating and heated at 240° C. for 1 minute to form a resist underlayer film layer (B) (20 nm). On the hardmask of the resist underlayer film layer (B), a resist (a methacrylate resin resist) solution for EUV was applied by spin coating and heated to form an EUV resist layer (C). The EUV resist layer (C) was exposed to light by using an EUV exposure device under the condition of NA=0.30, σ=0.3/0.7 Annular. After the exposure, PEB was performed, and then the resist film was cooled to room temperature on a cooling plate. Development with an alkaline aqueous solution (a 2.38% by mass aqueous solution of tetramethylammonium hydroxide) was performed, followed by a rinse treatment to form a resist pattern. The resist pattern was evaluated according to the following criteria: a 26 nm line and space pattern was formed or not, and the patterned shape was good or not as determined by the observation of the section of the pattern.

In Table 6, "Good" means the state in which the pattern shape is intermediate between the footing shape and the undercut shape, and there is not a significant amount of residues in a space portion. "Collapse" means the unfavorable state in which the resist pattern is peeled off and collapsed. "Bridge" means the unfavorable state in which the top portions or bottom portions of the resist patterns are in contact with each other.

TABLE 6

|  | 26 nm Pattern Shape |
| --- | --- |
| Example 15 | Good |
| Example 16 | Good |
| Example 17 | Good |
| Example 18 | Good |
| Example 19 | Good |
| Example 20 | Good |
| Example 21 | Good |
| Example 22 | Good |
| Example 23 | Good |
| Example 24 | Good |
| Example 25 | Good |
| Example 26 | Good |
| Example 27 | Good |
| Example 28 | Good |
| Example 29 | Good |
| Example 30 | Good |
| Example 31 | Good |
| Example 32 | Good |
| Example 33 | Good |
| Example 34 | Good |
| Example 35 | Good |
| Example 36 | Good |
| Example 37 | Good |
| Example 38 | Good |
| Example 39 | Good |
| Example 40 | Good |
| Comparative Example 1 | Collapse |

Evaluation on Process in which Organic Solvent is Used as Developing Solution for Resist Synthesis Example 28

22.68 g (70 mol %) of tetramethoxysilane, 7.25 g (25 mol %) of methyltrimethoxysilane, 4.40 g of triethoxysilyl propyl diallyl isocyanurate, and 51.49 g of acetone were charged in a 300 ml flask, and 14.18 g of 0.01 mol/l hydrochloric acid was dropped to the mixed solution while the mixed solution was stirred with a magnetic stirrer. After the addition, the flask was placed in an oil bath whose temperature was adjusted to 85° C., and the solution was warmed to reflux for 240 minutes to be reacted. The reaction solution was then cooled to room temperature, and 68.00 g of propylene glycol monomethyl ether acetate was added to the reaction solution to remove methanol as a reaction by-product, acetone, water, and hydrochloric acid, by vacuum distillation. After the solution was concentrated, a propylene glycol monomethyl ether acetate solution of a hydrolyzed condensate (polymer) was obtained. Propylene glycol monoethyl ether was added to the solution such that the solvent ratio of propylene glycol monomethyl ether acetate/propylene glycol monoethyl ether was 20/80 and the solution was adjusted to be 20% by weight in terms of the solid residue at 140° C. The obtained polymer corresponds to Formula (B-6), and the weight-average molecular weight determined by GPC was Mw 2,000 in terms of polystyrene.

Synthesis Example 29

21.62 g (70 mol %) of tetramethoxysilane, 4.15 g (15 mol %) of methyltrimethoxysilane, 4.20 g (5 mol %) of triethoxysilyl propyl diallyl isocyanurate, 4.63 g (10 mol %) of [4-(methoxymethoxy)phenyl]trimethoxysilane, and 51.89 g of acetone were charged in a 300 ml flask, and 13.52 g of 0.01 mol/l hydrochloric acid was dropped to the mixed solution while the mixed solution was stirred with a magnetic stirrer. After the addition, the flask was placed in an oil bath whose temperature was adjusted to 85° C., and the solution was warmed to reflux for 240 minutes to be reacted. The reaction solution was then cooled to room temperature, and 68.00 g of propylene glycol monomethyl ether acetate was added to the reaction solution to remove methanol as a reaction by-product, acetone, water, and hydrochloric acid, by vacuum distillation. After the solution was concentrated, a propylene glycol monomethyl ether acetate solution of a hydrolyzed condensate (polymer) was obtained. Propylene glycol monoethyl ether was added to the solution such that the solvent ratio of propylene glycol monomethyl ether acetate/propylene glycol monoethyl ether was 20/80 and the solution was adjusted to be 20% by weight in terms of the solid residue at 140° C. The obtained polymer corresponds to Formula (B-16), and the weight-average molecular weight determined by GPC was Mw 2,000 in terms of polystyrene.

Synthesis Example 30

21.12 g (70 mol %) of tetramethoxysilane, 5.40 g (20 mol %) of methyltrimethoxysilane, 8.20 g of triethoxysilyl propyl diallyl isocyanurate, and 52.08 g of acetone were charged in a 300 ml flask, and 13.21 g of 0.01 mol/l hydrochloric acid was dropped to the mixed solution while the mixed solution was stirred with a magnetic stirrer. After the addition, the flask was placed in an oil bath whose temperature was adjusted to 85° C., and the solution was warmed to reflux for 240 minutes to be reacted. The reaction solution was then cooled to room temperature, and 68.00 g of propylene glycol monomethyl ether acetate was added to the reaction solution to remove methanol as a reaction by-product, acetone, water, and hydrochloric acid, by vacuum distillation. After the solution was concentrated, a propylene glycol monomethyl ether acetate solution of a hydrolyzed condensate (polymer) was obtained. Propylene glycol monoethyl ether was added to the solution such that the solvent ratio of propylene glycol monomethyl ether acetate/propylene glycol monoethyl ether was 20/80 and the solution was adjusted to be 20% by weight in terms of the solid residue at 140° C. The obtained polymer corresponds to Formula (B-6), and the weight-average molecular weight determined by GPC was Mw 2,000 in terms of polystyrene.

Comparative Synthesis Example 2

23.25 g (70 mol %) of tetramethoxysilane, 5.95 g (20 mol %) of methyltrimethoxysilane, 4.98 g (10 mol %) of [4-(methoxymethoxy)phenyl]trimethoxysilane, and 51.27 g of acetone were charged in a 300 ml flask, and 14.54 g of 0.01 mol/l hydrochloric acid was dropped to the mixed solution while the mixed solution was stirred with a magnetic stirrer. After the addition, the flask was placed in an oil bath whose temperature was adjusted to 85° C., and the solution was warmed to reflux for 240 minutes to be reacted. The reaction solution was then cooled to room temperature, and 68.00 g of propylene glycol monomethyl ether acetate was added to the reaction solution to remove methanol as a reaction by-product, acetone, water, and hydrochloric acid, by vacuum distillation. After the solution was concentrated, a propylene glycol monomethyl ether acetate solution of a hydrolyzed condensate (polymer) was obtained. Propylene glycol monoethyl ether was added to the solution such that the solvent ratio of propylene glycol monomethyl ether acetate/propylene glycol monoethyl ether was 20/80 and the solution was adjusted to be 20% by weight in terms of the solid residue at 140° C. The weight-average molecular weight of the obtained polymer determined by GPC was Mw 2,000 in terms of polystyrene.

TABLE 7

|  | Polymer | Acid | Curing Catalyst | Other Additive | Solvent | | | |
|---|---|---|---|---|---|---|---|---|
| Example 41 | Synthesis Example 28 | MA | IMIDTEOS | BPS | PGME | PGEE | PGMEA | Water |
| (Parts by mass) | 2 | 0.02 | 0.006 | 0.1 | 10 | 76 | 7 | 7 |
| Example 42 | Synthesis Example 29 | MA | IMIDTEOS | BPS | PGME | PGEE | PGMEA | Water |
| (Parts by mass) | 2 | 0.02 | 0.006 | 0.1 | 10 | 76 | 7 | 7 |
| Example 43 | Synthesis Example 28 | MA | IMIDTEOS | BPS | PGME | PGEE | PGMEA | Water |
| (Parts by mass) | 2 | 0.04 | 0.012 | 0.1 | 10 | 76 | 7 | 7 |
| Example 44 | Synthesis Example 28 | MA | BTEAC | BPS | PGME | PGEE | PGMEA | Water |
| (Parts by mass) | 2 | 0.02 | 0.006 | 0.1 | 10 | 76 | 7 | 7 |
| Example 45 | Synthesis Example 28 | MA | TPSN03 | BPS | PGME | PGEE | PGMEA | Water |
| (Parts by mass) | 2 | 0.02 | 0.006 | 0.1 | 10 | 76 | 7 | 7 |
| Example 46 | Synthesis Example 30 | MA | TPSN03 | BPS | PGME | PGEE | PGMEA | Water |
| (Parts by mass) | 2 | 0.02 | 0.006 | 0.1 | 10 | 76 | 7 | 7 |

TABLE 7-continued

| | Polymer | Acid | Curing Catalyst | Other Additive | | | Solvent | | |
|---|---|---|---|---|---|---|---|---|---|
| Example 47 | Synthesis Example 28 | MA | TPSN03 | BPS | | PGME | PGEE | PGMEA | Water |
| (Parts by mass) | 2 | 0.06 | 0.04 | 0.1 | | 10 | 76 | 7 | 7 |
| Example 48 | Synthesis Example 28 | MA | TPSN03 | TPSCS | | PGME | PGEE | PGMEA | Water |
| (Parts by mass) | 2 | 0.06 | 0.04 | 0.1 | | 10 | 76 | 7 | 7 |
| Example 49 | Synthesis Example 28 | MA | TPSN03 | TPSCS | BPS | PGME | PGEE | PGMEA | Water |
| (Parts by mass) | 2 | 0.06 | 0.04 | 0.1 | 0.1 | 10 | 76 | 7 | 7 |
| Comparative Example 7 | Comparative Synthesis Example 2 | MA | IMIDTEOS | BPS | | PGME | PGEE | PGMEA | Water |
| (Parts by mass) | 2 | 0.02 | 0.006 | 0.1 | | 10 | 76 | 7 | 7 |

(Preparation of Organic Resist Underlayer Film (A3 Layer))

30.0 g of 4-hydroxyphenyl methacrylamide, 37.3 g of 1-adamantyl methacrylate, 14.9 g of benzyl methacrylate, and 4.11 g of 2,2'-azobisisobutyronitrile were dissolved in 345.4 g of propylene glycol monomethyl ether, and the solution was heated at 85° C. and stirred for about 20 hours. The obtained resin corresponds to Formula (C-2) below. The weight-average molecular weight determined by GPC was Mw 6,100 in terms of polystyrene.

Formula (C-2)

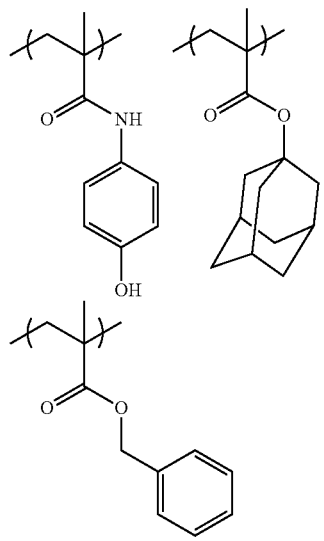

2 g of the obtained resin, 0.3 g of tetramethoxymethyl glycoluril, 0.03 g of pyridinium para-toluenesulfonate as a catalyst, and 0.01 g of the surfactant MEGAFAC R-30 (trade name, manufactured by DIC Corporation, the component thereof is a fluorine surfactant), were dissolved in 16.1 g of propylene glycol monomethyl ether and 6.9 g of propylene glycol monomethyl ether acetate to prepare a solution. Subsequently, the solution was filtrated through a polyethylene microfilter having a pore size of 0.2 μm to prepare a solution of an organic underlayer film (A3 layer)-forming composition used for a multilayer film lithography process.

(Measurement of Dry Etching Rate)

The etcher and etching gas used for measuring a dry etching rate are described below:
ES401 (manufactured by Nippon Scientific Co., Ltd.), $CF_4$; and
RIE-10NR (manufactured by SAMCO INC.), $O_2$.

Each of the solutions of Si-containing resist underlayer film-forming compositions prepared in Examples 41 to 49 and Comparative Example 7 was applied onto a silicon wafer by using a spinner. The silicon wafer was heated on a hot plate at 240° C. for 1 minute. In such a manner, Si-containing resist underlayer films (having a film thickness of 50 nm (for etching rate measurements with $CF_4$ gas and $O_2$ gas, respectively)), were formed. Similarly, on a silicon wafer, the organic underlayer film (A3 layer)-forming composition was applied by using a spinner to form a film (having a film thickness of 0.20 μm). The dry etching rate was measured by using $O_2$ gas as an etching gas, and the result was compared with each of the dry etching rates of Si-containing resist underlayer films of Examples 41 to 49 and Comparative Example 7.

Table 8 shows each of etch rates when fluorine based gas ($CF_4$ gas) was used (an etching rate is nm/minute) and each of oxygen based gas ($O_2$ gas) resistances as an etch rate ratio of (the resist underlayer film of the present invention)/(the organic underlayer film: A3 layer).

TABLE 8

| | Fluorine based Gas Etch Rate (nm/min) | Oxygen based Gas Resistance (vs Organic Underlayer Film A3 Layer) |
|---|---|---|
| Example 41 | 23 | 0.03 |
| Example 42 | 23 | 0.03 |
| Example 43 | 23 | 0.03 |
| Example 44 | 23 | 0.03 |
| Example 45 | 23 | 0.03 |
| Example 46 | 24 | 0.04 |
| Example 47 | 23 | 0.03 |
| Example 48 | 23 | 0.03 |
| Example 49 | 23 | 0.03 |
| Comparative Example 7 | 21 | 0.03 |

[Resist Pattern Formation by EUV Exposure]

A silicon wafer was coated with the organic underlayer film (A3 layer)-forming composition, and was baked on a hot plate at 240° C. for 60 seconds to obtain an organic underlayer film (A3 layer) having a film thickness of 90 nm.

On the organic underlayer film (A3 layer), each of the resist underlayer film-forming composition solutions, which were prepared in Examples 41 to 49 and Comparative Example 7, was applied by spin coating and heated at 240° C. for 1 minute to form a resist underlayer film layer (B) (20 nm). On the hardmask of the resist underlayer film layer (B), a resist (an NTD resist manufactured by FUJIFILM Electronic Materials Co., Ltd.) solution for EUV was applied by spin coating and heated to form an EUV resist layer (C). The EUV resist layer (C) was exposed to light by using an EUV exposure device under the condition of NA=0.30, σ=0.3/0.7 Annular. After the exposure, PEB was performed, and then the resist film was cooled to room temperature on a cooling plate. Development was performed with FN-DP001 (an organic solvent/butyl acetate) manufactured by FUJIFILM Electronic Materials Co., Ltd., followed by a rinse treatment to form a resist pattern. The resist pattern was evaluated according to the following criteria: a 26 nm line and space pattern of is formed or not, and the patterned shape was good or not as determined by the observation of the section of the pattern.

In Table 2, "Good" means the state in which the pattern shape is intermediate between the footing shape and the undercut shape, and there is not a significant amount of residues in a space portion. "Collapse" means the unfavorable state in which the resist pattern is peeled off and collapsed. "Bridge" means the unfavorable state in which the top portions or bottom portions of the resist patterns are in contact with each other.

TABLE 9

|  | Pattern Shape |
| --- | --- |
| Example 41 | Good |
| Example 42 | Good |
| Example 43 | Good |
| Example 44 | Good |
| Example 45 | Good |
| Example 46 | Good |
| Example 47 | Good |
| Example 48 | Good |
| Example 49 | Good |
| Comparative Example 7 | Bridge |

INDUSTRIAL APPLICABILITY

The thin film-forming composition of the present invention can be utilized in resist underlayer film-forming compositions for photoresists, EUV resists, or the like; EUV resist top layer film-forming compositions; reverse material-forming compositions, and the like.

The invention claimed is:

1. A resist underlayer film-forming composition for EUV lithography, comprising:
   water;
   polysiloxane (A) containing a hydrolyzed condensate of hydrolyzable silane (a); and
   hydrolyzable silane compound (b) having a sulfonamide structure, a carboxylic acid amide structure, a urea structure, or an isocyanuric acid structure.

2. The resist underlayer film-forming composition according claim 1, wherein
   hydrolyzable silane (a) is at least one hydrolyzable silane selected from the group consisting of a tetraalkoxysilane, an alkyltrialkoxysilane, and an aryltrialkoxysilane.

3. The resist underlayer film-forming composition according to claim 2, wherein
   the alkyltrialkoxysilane is a methyltrialkoxysilane.

4. The resist underlayer film-forming composition according to claim 2, wherein
   the aryltrialkoxysilane is a phenyltrialkoxysilane.

5. The resist underlayer film-forming composition according to claim 1, wherein
   the hydrolyzable silane compound (b) is a silane compound of General Formula (b-1):

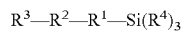

$$R^3-R^2-R^1-Si(R^4)_3 \qquad \text{Formula (b-1)}$$

where
   $R^4$ is a $C_{1-10}$ alkoxy group;
   $R^1$ is a $C_{1-10}$ alkylene group;
   $R^3$ is a hydrogen atom, a $C_{1-10}$ alkyl group, a $C_{1-10}$ fluoroalkyl group, a $C_{2-10}$ alkenyl group, or a $C_{6-20}$ aryl group; and
   $R^2$ is selected from the group consisting of
   a sulfonamide structure,
   a carboxylic acid amide structure,
   a urea structure,
   an isocyanuric acid structure,

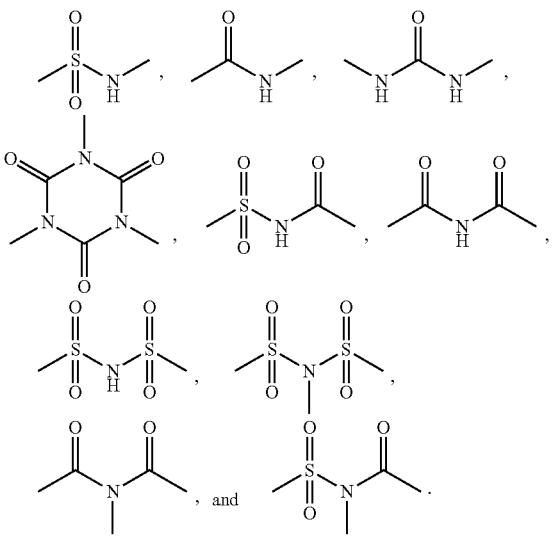

6. The resist underlayer film-forming composition according to claim 1, wherein
   polysiloxane (A) is obtained by co-hydrolyzing and condensing 70 mol of a tetraalkoxysilane with 10 to 35 mol of an alkyltrialkoxysilane and 2 to 25 mol of an aryltrialkoxysilane.

7. The resist underlayer film-forming composition according to claim 1, further comprising an acid compound.

8. The resist underlayer film-forming composition according to claim 1, further comprising an ammonium compound, a cyclic ammonium compound, a cyclic amine compound, or a sulfonium compound.

9. A resist underlayer film obtained by applying the resist underlayer film-forming composition as claimed in claim 1 onto a semiconductor substrate, and then baking the applied resist underlayer film-forming composition.

10. A method for manufacturing a semiconductor device, the method comprising:
    forming a resist underlayer film by applying the resist underlayer film-forming composition as claimed in claim 1 onto a semiconductor substrate, and then baking the applied resist underlayer film-forming composition;

forming a resist film by applying a composition for a resist onto the resist underlayer film;

exposing the resist film to light;

obtaining a patterned resist film by developing the exposed resist film;

etching the resist underlayer film with the patterned resist film; and processing the semiconductor substrate with the patterned resist film and the resist underlayer film.

11. The method for manufacturing a semiconductor device according to claim 10, wherein the development is conducted with an alkaline aqueous solution or an organic solvent.

12. A method for manufacturing a semiconductor device, the method comprising:

forming an organic underlayer film on a semiconductor substrate;

forming a resist underlayer film by applying the resist underlayer film-forming composition as claimed in claim 1 onto the organic underlayer film, and then baking the applied resist underlayer film-forming composition;

forming a resist film by applying a composition for a resist onto the resist underlayer film;

exposing the resist film to light;

obtaining a patterned resist film by developing the exposed resist;

etching the resist underlayer film with the patterned resist film;

etching the organic underlayer film with the patterned resist underlayer film; and processing the semiconductor substrate with the patterned organic underlayer film.

13. The resist underlayer film-forming composition according to claim 1, wherein the hydrolyzable silane compound (b) is a silane compound of General Formula (b-1):

Formula (b-1)

where $R^1$ is a $C_{1-10}$ alkylene group;

$R^2$ is selected from the group consisting of

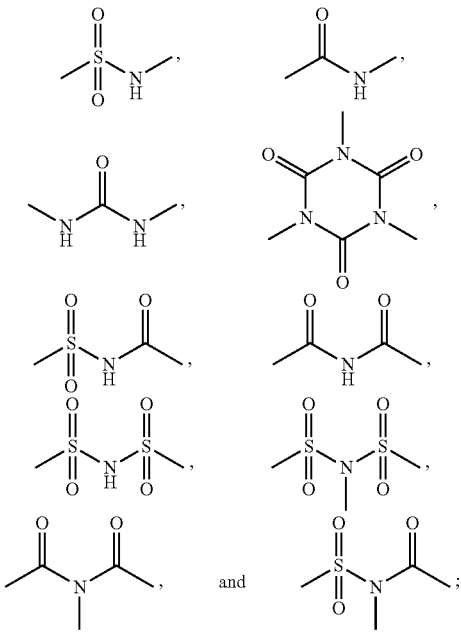

$R^3$ is a hydrogen atom, a $C_{1-10}$ alkyl group, a $C_{1-10}$ fluoroalkyl group, a $C_{2-10}$ alkenyl group, or a $C_{6-20}$ aryl group; and $R^4$ is a $C_{1-10}$ alkoxy group.

14. The resist underlayer film-forming composition according to claim 1, wherein the hydrolyzable silane compound (b) is a silane compound of General Formula (b-1):

Formula (b-1)

where $R^1$ is a $C_{1-10}$ alkylene group;

$R^2$ is selected from the group consisting of a sulfonamide structure, a carboxylic acid amide structure, a urea structure, and an isocyanuric acid structure;

$R^3$ is a hydrogen atom, a $C_{1-10}$ alkyl group, a $C_{1-10}$ fluoroalkyl group, a $C_{2-10}$ alkenyl group, or a $C_{6-20}$ aryl group; and $R^4$ is a $C_{1-10}$ alkoxy group.

* * * * *